US012578924B2

(12) United States Patent
Seo et al.

(10) Patent No.: US 12,578,924 B2
(45) Date of Patent: Mar. 17, 2026

(54) ADDER CELL AND INTEGRATED CIRCUIT INCLUDING THE SAME

(71) Applicant: SAMSUNG ELECTRONICS CO., LTD., Suwon-si (KR)

(72) Inventors: Jaewoo Seo, Seoul (KR); Minjae Jeong, Yongin-si (KR); Yongdurk Kim, Hwaseong-si (KR); Giyoung Yang, Seoul (KR); Eungchul Jun, Seongnam-si (KR); Changbeom Kim, Tongyeong-si (KR); Moogyu Bae, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1114 days.

(21) Appl. No.: 17/563,836

(22) Filed: Dec. 28, 2021

(65) Prior Publication Data

US 2022/0253283 A1     Aug. 11, 2022

(30) Foreign Application Priority Data

Feb. 10, 2021     (KR) ........................ 10-2021-0019370

(51) Int. Cl.
| | |
|---|---|
| *G06F 7/501* | (2006.01) |
| *H10D 30/67* | (2025.01) |
| *H10D 62/10* | (2025.01) |
| *H10D 84/85* | (2025.01) |
| *H10D 89/10* | (2025.01) |

(52) U.S. Cl.
CPC ......... *G06F 7/501* (2013.01); *H10D 30/6735* (2025.01); *H10D 30/6757* (2025.01); *H10D 62/118* (2025.01); *H10D 84/85* (2025.01); *H10D 89/10* (2025.01)

(58) Field of Classification Search
CPC ...... G06F 7/501–5095; H10D 30/6735; H10D 30/6757; H10D 62/118; H10D 84/85; H10D 84/975; H10D 89/10
See application file for complete search history.

(56) References Cited

U.S. PATENT DOCUMENTS

| | | | |
|---|---|---|---|
| 6,198,324 B1 | 3/2001 | Schober | |
| 6,297,668 B1 | 10/2001 | Schober | |
| 6,333,656 B1 | 12/2001 | Schober | |
| 6,480,875 B1 | 11/2002 | Miyoshi et al. | |
| 7,747,976 B2 | 6/2010 | Liao | |
| 10,192,860 B2 | 1/2019 | Seo et al. | |

(Continued)

FOREIGN PATENT DOCUMENTS

JP     3660184 B2     6/2005

*Primary Examiner* — Carlo Waje
(74) *Attorney, Agent, or Firm* — Sughrue Mion, PLLC

(57) ABSTRACT

A multi-height adder cell configured to receive a first input signal, a second input signal, and a carry input signal and output a sum output signal and a carry output signal, including a plurality of circuit areas, including a plurality of first gate lines to which the first input signal is applied and a plurality of second gate lines to which the second input signal is applied, wherein at least one of a first circuit area and a second circuit area is arranged in a first row, at least one of a third circuit area and a fourth circuit area is arranged in a second row parallel with the first row, and a first gate line of a circuit area arranged in the first row is aligned with a first gate line of a circuit area arranged in the second row.

18 Claims, 15 Drawing Sheets

(56)          References Cited

U.S. PATENT DOCUMENTS

| | | | |
|---|---|---|---|
| 10,270,430 B2 | 4/2019 | Guo et al. | |
| 10,672,756 B2 | 6/2020 | Mittal et al. | |
| 2008/0169487 A1 | 7/2008 | Shimbo et al. | |
| 2011/0049575 A1* | 3/2011 | Tanaka | H10D 84/907 |
| | | | 257/E27.013 |
| 2021/0271797 A1* | 9/2021 | Lai | G06F 30/392 |

* cited by examiner

: Cell Boundary
: Substrate
: Active Region
: Gate Line
: M1
: M2
: V0
: V1

FIG. 10

ADDER CELL AND INTEGRATED CIRCUIT INCLUDING THE SAME

CROSS-REFERENCE TO RELATED APPLICATION

This application is based on and claims priority under 35 U. S. C. § 119 to Korean Patent Application No. 10-2021-0019370, filed on Feb. 10, 2021, in the Korean Intellectual Property Office, the disclosure of which is incorporated by reference herein in its entirety.

BACKGROUND

1. Field

The disclosure relates to an adder cell, and more particularly, to an adder cell, that is, a multi-height cell, and an integrated circuit including the same.

2. Description of Related Art

An integrated circuit may be designed based on standard cells. Specifically, the layout of an integrated circuit may be generated by arranging standard cells in accordance with data defining the integrated circuit and routing the arranged standard cells. The standard cells may have various heights and a standard cell having a height equal to a multiple of a height of a row may be referred to as a multi-height cell.

In general, because an adder is widely used for a digital signal processing device including a computing device, in the information age, the adder may be used for a new data processing method of rapidly processing a large amount of information signals. Therefore, in an integrated circuit such as a computing device and a data processing device for rapidly processing a large amount of information signals of a system, a configuration of an adder facilitating a configuration of a high value-added system by increasing a processing speed of data is important.

SUMMARY

Provided are an adder cell, that is, a multi-height cell, and an integrated circuit including the same.

Additional aspects will be set forth in part in the description which follows and, in part, will be apparent from the description, or may be learned by practice of the presented embodiments.

In accordance with an aspect of the disclosure, a multi-height adder cell configured to receive a first input signal, a second input signal, and a carry input signal and output a sum output signal and a carry output signal, includes a plurality of circuit areas, including a plurality of first gate lines to which the first input signal is applied and a plurality of second gate lines to which the second input signal is applied, wherein at least one of a first circuit area of the plurality of circuit areas and a second circuit area of the plurality of circuit areas is arranged in a first row, wherein at least one of a third circuit area of the plurality of circuit areas and a fourth circuit area of the plurality of circuit areas is arranged in a second row parallel with the first row in a first horizontal direction, and wherein a first gate line formed in a circuit area arranged in the first row is aligned in the first horizontal direction with a first gate line formed in a circuit area arranged in the second row.

In accordance with an aspect of the disclosure, a multi-height adder cell configured to receive a first input signal and a second input signal, and to output a sum output signal and a carry output signal includes a first circuit area and a second circuit area, wherein the first input signal is applied to a first gate line of the first circuit area and a first gate line of the second circuit area, and the second input signal is applied to a second gate line of the first circuit area and a second gate line of the second circuit area, wherein the first circuit area is arranged in a first row and the second circuit area is arranged in a second row parallel with the first row in a first horizontal direction, wherein the first gate line of the first circuit area is aligned in the first horizontal direction with the first gate line of the second circuit area, and wherein the second gate line of the first circuit area is aligned in the first horizontal direction with the second gate line of the second circuit area.

In accordance with an aspect of the disclosure, a multi-height adder cell configured to receive a first input signal and a second input signal and output a sum output signal, includes a first circuit area and a second circuit area, wherein the first input signal is applied to a gate end of a first n-type transistor of the first circuit area, a gate end of a first p-type transistor of the first circuit area, a gate end of a first n-type transistor of the second circuit area, and a gate end of a first p-type transistor of the second circuit area, wherein the second input signal is applied to a gate end of a second n-type transistor of the first circuit area, a gate end of a second p-type transistor of the first circuit area, a gate end of a second n-type transistor of the second circuit area, and a gate end of a second p-type transistor of the second circuit area, wherein the first circuit area is arranged in a first row and the second circuit area is arranged in a second row parallel with the first row in a first horizontal direction, and wherein a gate line to which the first input signal is applied in the first circuit area is aligned in the first horizontal direction with a gate line to which the first input signal is applied in the second circuit area.

In accordance with an aspect of the disclosure, a multi-height adder cell configured to receive a first input signal, a second input signal, and a carry input signal and output a sum output signal and a carry output signal includes a first circuit area and a second circuit area arranged in a first row; a third circuit area arranged in a second row parallel with the first row in a horizontal direction; a first gate line to which the first input signal is applied, the first gate line extending in the horizontal direction from the first circuit area to the third circuit area; a second gate line to which the second input signal is applied, the second gate line extending in the horizontal direction from the first circuit area to the third circuit area; and a third gate line to which the carry input signal is applied, the third gate line extending in the horizontal direction from the first circuit area to the third circuit area.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 10 is a circuit diagram of an adder cell according to an exemplary embodiment;

The drawings accompanying the present disclosure may not be to scale, and sizes of components illustrated therein may be exaggerated or reduced.

DETAILED DESCRIPTION OF THE EMBODIMENTS

Figure 1:
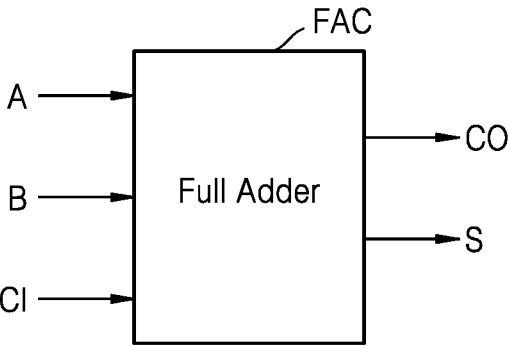
FIG. 1 is a block diagram of an adder cell according to an exemplary embodiment.
Figure 2:
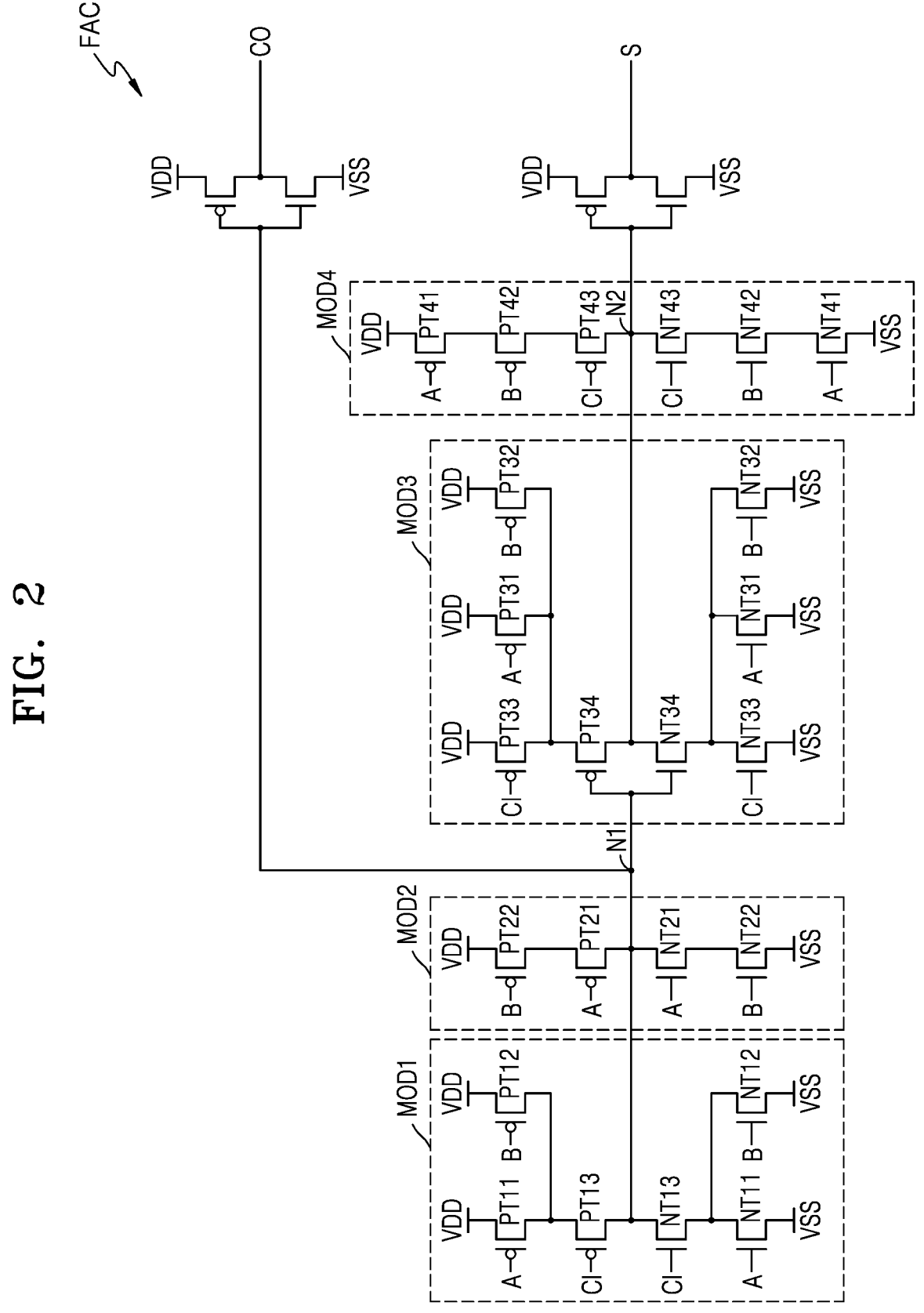
FIG. 2 is a circuit diagram of an adder cell according to an exemplary embodiment.

FIG. 1 is a block diagram of an adder cell FAC according to an exemplary embodiment and FIG. 2 is a circuit diagram of an adder cell according to an exemplary embodiment.

Referring to FIG. 1, the adder cell FAC may be a full adder cell and a circuit formed in the adder cell FAC may be a logic combinational circuit configured to calculate the sum of three input bits. The adder cell FAC may receive a first input signal A, a second input signal B, and a carry input signal CI and may output a sum signal S and a carry output signal CO according to the first input signal A, the second input signal B, and the carry input signal CI.

Referring to FIGS. 1 and 2, the adder cell FAC may include first to fourth circuits MOD1 to MOD4 and may further include an inverter connected to a first node N1 to output the carry output signal CO and an inverter connected to a second node N2 to output the sum signal S. The first to fourth circuits MOD1 to MOD4 may receive at least two of the first input signal A, the second input signal B, and the carry input signal CI and may respectively output first to fourth outputs. In embodiments, the first circuit MOD1 may output the first output, the second circuit MOD2 may output the second output, the third circuit MOD3 may output the third output, and the fourth circuit MOD4 may output the fourth output. The first to fourth outputs may be calculated as follows. COB may mean an inverted signal of the carry output signal CO.

First output=$CIA$+$CIB$

Second output=$AB$

Third output=$COB(A$+$B$+$CI)$

Fourth output=$ABCI$

The first circuit MOD1 may include a first P type transistor PT11 to a gate end of which the first input signal A is input, a second P type transistor PT12 to a gate end of which the second input signal B is input, and a third P type transistor PT13 to a gate end of which the carry input signal CI is input. In addition, the first circuit MOD1 may include a first N type transistor NT11 to a gate end of which the first input signal A is input, a second N type transistor NT12 to a gate end of which the second input signal B is input, and a third N type transistor NT13 to a gate end of which the carry input signal CI is input.

A first voltage, for example, a power voltage VDD may be applied to a first end of each of the first P type transistor PT11 and the second P type transistor PT12 and the third P type transistor PT13 may be connected to a second end of each of the first P type transistor PT11 and the second P type transistor PT12. A first end of the third P type transistor PT13 may be connected to the first P type transistor PT11 and the second P type transistor PT12 and a second end of the third P type transistor PT13 may be connected to the first node N1.

A second voltage, for example, a ground voltage VSS may be applied to a first end of each of the first N type transistor NT11 and the second N type transistor NT12 and the third N type transistor NT13 may be connected to a second end of each of the first N type transistor NT11 and the second N type transistor NT12. A first end of the third N type transistor NT13 may be connected to the first N type transistor NT11 and the second N type transistor NT12 and a second end of the third N type transistor NT13 may be connected to the first node N1.

The second circuit MOD2 may include a first P type transistor PT21 to a gate end of which the first input signal A is input, a second P type transistor PT22 to a gate end of which the second input signal B is input, a first N type transistor NT21 to a gate end of which the first input signal A is input, and a second N type transistor NT22 to a gate end of which the second input signal B is input.

The second P type transistor PT22, the first P type transistor PT21, the first N type transistor NT21, and the second N type transistor NT22 may be serially connected to one another. The first voltage VDD may be applied to a first end of the second P type transistor PT22 and a second end of the second P type transistor PT22 may be connected to the first P type transistor PT21. A first end of the first P type transistor PT21 may be connected to the second P type transistor PT22 and a second end of the first P type transistor PT21 may be connected to the first node N1. The second voltage VSS may be applied to a first end of the second N type transistor NT22 and a second end of the second N type transistor NT22 may be connected to the first N type transistor NT21. A first end of the first N type transistor NT21 may be connected to the second N type transistor NT22 and a second end of the first N type transistor NT21 may be connected to the first node N1.

The third circuit MOD3 may include a first P type transistor PT31 to a gate end of which the first input signal A is input, a second P type transistor PT32 to a gate end of which the second input signal B is input, a third P type transistor PT33 to a gate end of which the carry input signal CI is input, and a fourth P type transistor PT34 of which gate end is connected to the first node N1. In addition, the third circuit MOD3 may include a first N type transistor NT31 to a gate end of which the first input signal A is input, a second N type transistor NT32 to a gate end of which the second input signal B is input, a third N type transistor NT33 to a gate end of which the carry input signal CI is input, and a fourth N type transistor NT34 of which gate end is connected to the first node N1.

The first voltage VDD may be applied to a first end of each of the first P type transistor PT31, the second P type transistor PT32, and the third P type transistor PT33 and a fourth P type transistor PT34 may be connected to a second end of each of the first P type transistor PT31, the second P type transistor PT32, and the third P type transistor PT33. A first end of the fourth P type transistor PT34 may be connected to the first P type transistor PT31, the second P type transistor PT32, and the third P type transistor PT33 and a second end of the fourth P type transistor PT34 may be connected to the second node N2.

The second voltage VSS may be applied to a first end of each of the first N type transistor NT31, the second N type transistor NT32, and the third N type transistor NT33 and a fourth N type transistor NT34 may be connected to a second end of each of the first N type transistor NT31, the second N type transistor NT32, and the third N type transistor NT33. A first end of the fourth N type transistor NT34 may be connected to the first N type transistor NT31, the second N type transistor NT32, and the third N type transistor NT33 and a second end of the fourth N type transistor NT34 may be connected to the second node N2.

The fourth circuit MOD4 may include a first P type transistor PT41 to a gate end of which the first input signal A is input, a second P type transistor PT42 to a gate end of which the second input signal B is input, a third P type transistor PT43 to a gate end of which the carry input signal CI is input, a first N type transistor NT41 to a gate end of which the first input signal A is input, a second N type transistor NT42 to a gate end of which the second input signal B is input, and a third N type transistor NT43 to a gate end of which the carry input signal CI is input.

The first P type transistor PT41, the second P type transistor PT42, the third P type transistor PT43, the third N type transistor NT43, the second N type transistor NT42, and the first N type transistor NT41 may be serially connected to one another, The first P type transistor PT41, the second P type transistor PT42, and the third P type transistor PT43 may be serially connected between a node to which the first voltage VDD is applied and the second node N2 and the first N type transistor NT41, the second N type transistor NT42, and the third N type transistor NT43 may be serially connected between a node to which the second voltage VSS is applied and the second node N2.

Therefore, the adder cell FAC may include 14 P type transistors and 14 N type transistors, that is, 28 transistors. The transistors included in the adder cell FAC may be respectively arranged in a plurality of columns of the adder cell FAC. Examples of arrangement of the transistors included in the adder cell FAC will be described below with reference to FIGS. 3 to 8.

Figure 3:
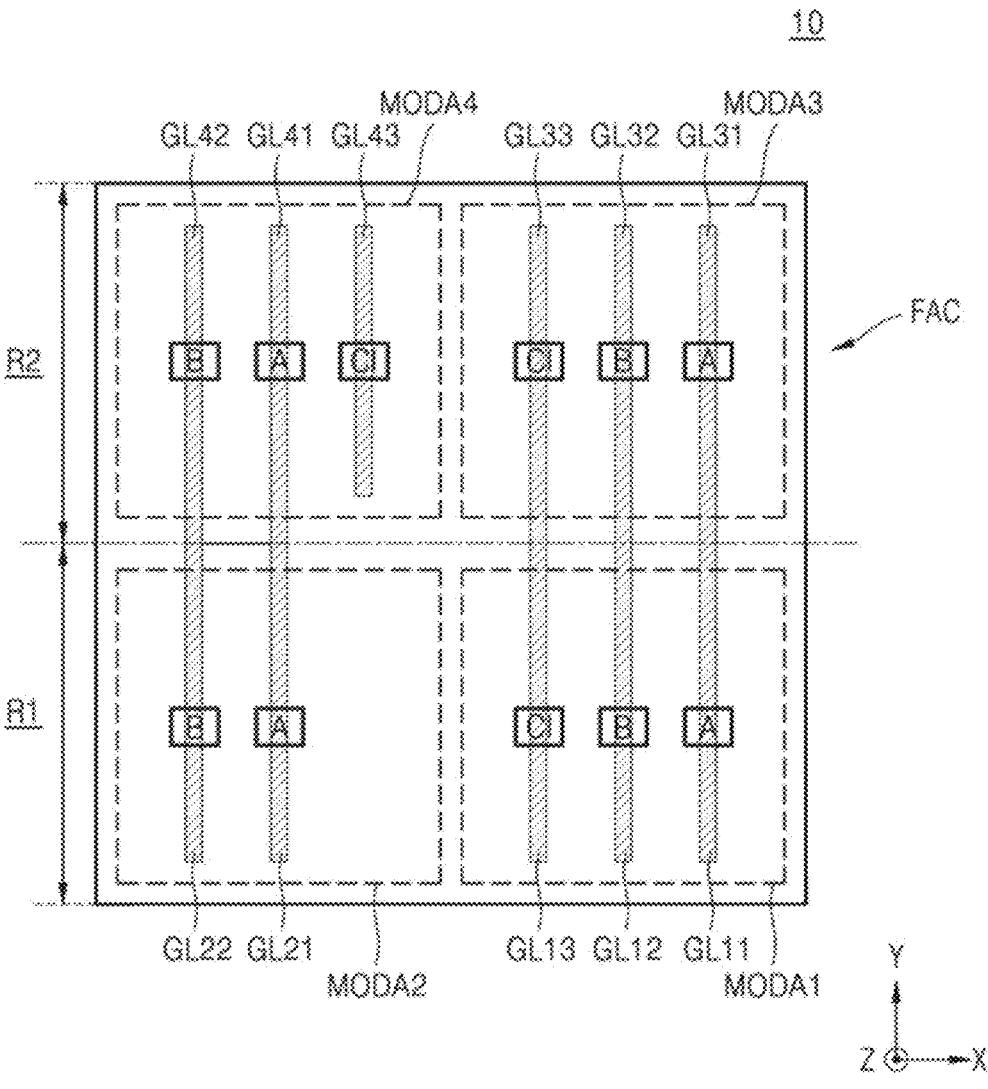
FIG. 3 is a plan view illustrating layout of an integrated circuit including an adder cell according to an exemplary embodiment.

FIG. 3 is a plan view illustrating layout of an integrated circuit 10 including an adder cell FAC according to an exemplary embodiment.

Specifically, FIG. 3 is a plan view illustrating the layout of the integrated circuit 10 including the adder cell FAC on a plane including an X axis and a Y axis. Throughout the current disclosure, each of an X axis direction and a Y axis direction may be referred to as a horizontal direction and a Z axis direction may be referred to as a vertical direction, unless specified otherwise. The plane including the X axis and the Y axis may be referred to as a horizontal plane and a component arranged in a +Z axis direction in comparison with another component may be referred to as being above the component and a component arranged in a −Z axis direction in comparison with another component may be referred to as being below the component, unless specified otherwise. A height of a component may refer to a length of the component in the Y axis direction, unless specified otherwise. In drawings of the current disclosure, for convenience sake, only partial layers may be illustrated and, in order to illustrate connection between a pattern of a metal layer and a lower conductive pattern, a via may be illustrated despite being positioned below the pattern of the metal layer.

A standard cell as a unit of the layout included in the integrated circuit 10 may be simply referred to as a cell in the current disclosure. The integrated circuit 10 may include a plurality of various standard cells. The standard cells may have a structure complying with a predetermined standard and may be arranged in a plurality of rows. For example, the adder cell FAC as a multi-height cell may be arranged in a plurality of columns.

Referring to FIG. 3, the adder cell FAC may include a first circuit area MODA1 in which the first circuit (for example, MOD1 of FIG. 2) is formed, a second circuit area MODA2 in which the second circuit (for example, MOD2 of FIG. 2) is formed, a third circuit area MODA3 in which the third circuit (for example, MOD3 of FIG. 2) is formed, and a fourth circuit area MODA4 in which the fourth circuit (for example, MOD4 of FIG. 2) is formed. The first circuit area MODA1 may include a first gate line GL11 to which the first input signal A is applied, a second gate line GL12 to which the second input signal B is applied, and a third gate line GL13 to which the carry input signal CI is applied and the second circuit area MODA2 may include a first gate line GL21 to which the first input signal A is applied and a second gate line GL22 to which the second input signal B is applied. The third circuit area MODA3 may include a first gate line GL31 to which the first input signal A is applied, a second gate line GL32 to which the second input signal B is applied, and a third gate line GL33 to which the carry input signal CI is applied and the fourth circuit area MODA4 may include a first gate line GL41 to which the first input signal A is applied, a second gate line GL42 to which the second input signal B is applied, and a third gate line GL43 to which the carry input signal CI is applied. Each of the first to third gate lines GL11, GL12, GL13, first to second gate lines GL21, GL22, first to third gate lines GL31, GL32, GL33, and first to third gate lines GL41, GL42, and GL43 may form a gate line pattern extending in the Y axis direction.

The adder cell FAC may be arranged in a first row R1 and a second row R2. In an exemplary embodiment, the first circuit area MODA1 and the second circuit area MODA2 may be arranged in the first row R1 and the third circuit area MODA3 and the fourth circuit area MODA4 may be arranged in the second row R2. The first row R1 and the second row R2 may be adjacent to each other, a height of the first row R1 in the Y axis direction may be the same as or different from a height of the second row R2 in the Y axis direction, and the height of the first row R1 in the Y axis direction and the height of the second row R2 in the Y axis direction may vary.

In an exemplary embodiment, at least one of the first gate lines GL11 and GL21 formed in the first circuit area MODA1 and the second circuit area MODA2 arranged in the first row R1 may be aligned with a corresponding gate line in the first gate lines GL31 and GL41 formed in the third circuit area MODA3 and the fourth circuit area MODA4 arranged in the second row R2 in the Y axis direction. For example, the first gate line GL11 of the first circuit area MODA1 and the first gate line GL31 of the third circuit area MODA3 may be aligned in the Y axis direction and the first gate line GL21 of the second circuit area MODA2 and the first gate line GL41 of the fourth circuit area MODA4 may be aligned in the Y axis direction. In addition, for example, the first gate line GL11 of the first circuit area MODA1 and the first gate line GL31 of the third circuit area MODA3 may form one gate line pattern and the first gate line GL21 of the second circuit area MODA2 and the first gate line GL41 of the fourth circuit area MODA4 may form one gate line pattern. That is, the first gate line GL11 of the first circuit area MODA1 may form the gate line pattern continuously extending in the first row R1 and the second row R2 in the Y axis direction. The adder cell FAC according to embodiments is not limited thereto and the first gate line GL11 of the first circuit area MODA1 and the first gate line GL31 of the third circuit area MODA3 may respectively form separate gate line patterns aligned in the Y axis direction and may be connected to each other through a first metal layer M1 or a second metal layer M2.

In an exemplary embodiment, at least one of the second gate lines GL12 and GL22 formed in the first circuit area MODA1 and the second circuit area MODA2 arranged in the first row R1 may be aligned with a corresponding gate line in the second gate lines GL32 and GL42 formed in the third circuit area MODA3 and the fourth circuit area MODA4 arranged in the second row R2 in the Y axis direction. For example, the second gate line GL12 of the first circuit area MODA1 and the second gate line GL32 of the third circuit area MODA3 may be aligned in the Y axis direction and the second gate line GL22 of the second circuit area MODA2 and the second gate line GL42 of the fourth circuit area MODA4 may be aligned in the Y axis direction. In addition, for example, the second gate line GL12 of the first circuit area MODA1 and the second gate line GL32 of the third circuit area MODA3 may form one gate line pattern and the second gate line GL22 of the second circuit area MODA2 and the second gate line GL42 of the fourth circuit area MODA4 may form one gate line pattern. The adder cell FAC according to embodiments is not limited thereto and the second gate line GL12 of the first circuit area MODA1 and the second gate line GL32 of the third circuit area MODA3 may respectively form separate gate line patterns aligned in the Y axis direction and may be connected to each other through the first metal layer M1 or the second metal layer M2.

In an exemplary embodiment, the third gate line GL13 formed in the first circuit area MODA1 arranged in the first row R1 may be aligned with a gate line in the third gate lines GL33 and GL43 formed in the third circuit area MODA3 and the fourth circuit area MODA4 arranged in the second row R2 in the Y axis direction. For example, the third gate line GL13 of the first circuit area MODA1 and the third gate line GL33 of the third circuit area MODA3 may be aligned in the Y axis direction. In addition, for example, the third gate line GL13 of the first circuit area MODA1 and the third gate line GL33 of the third circuit area MODA3 may form one gate line pattern. The adder cell FAC according to embodiments is not limited thereto and the third gate line GL13 of the first circuit area MODA1 and the third gate line GL33 of the third circuit area MODA3 may respectively form separate gate line patterns aligned in the Y axis direction and may be connected to each other through the first metal layer M1 or the second metal layer M2.

Paragraphs. FIG. 4B is a cross-sectional view of an adder cell according to an exemplary embodiment, which is taken along the line I-I' of FIG. 4A.

Figure 4A:
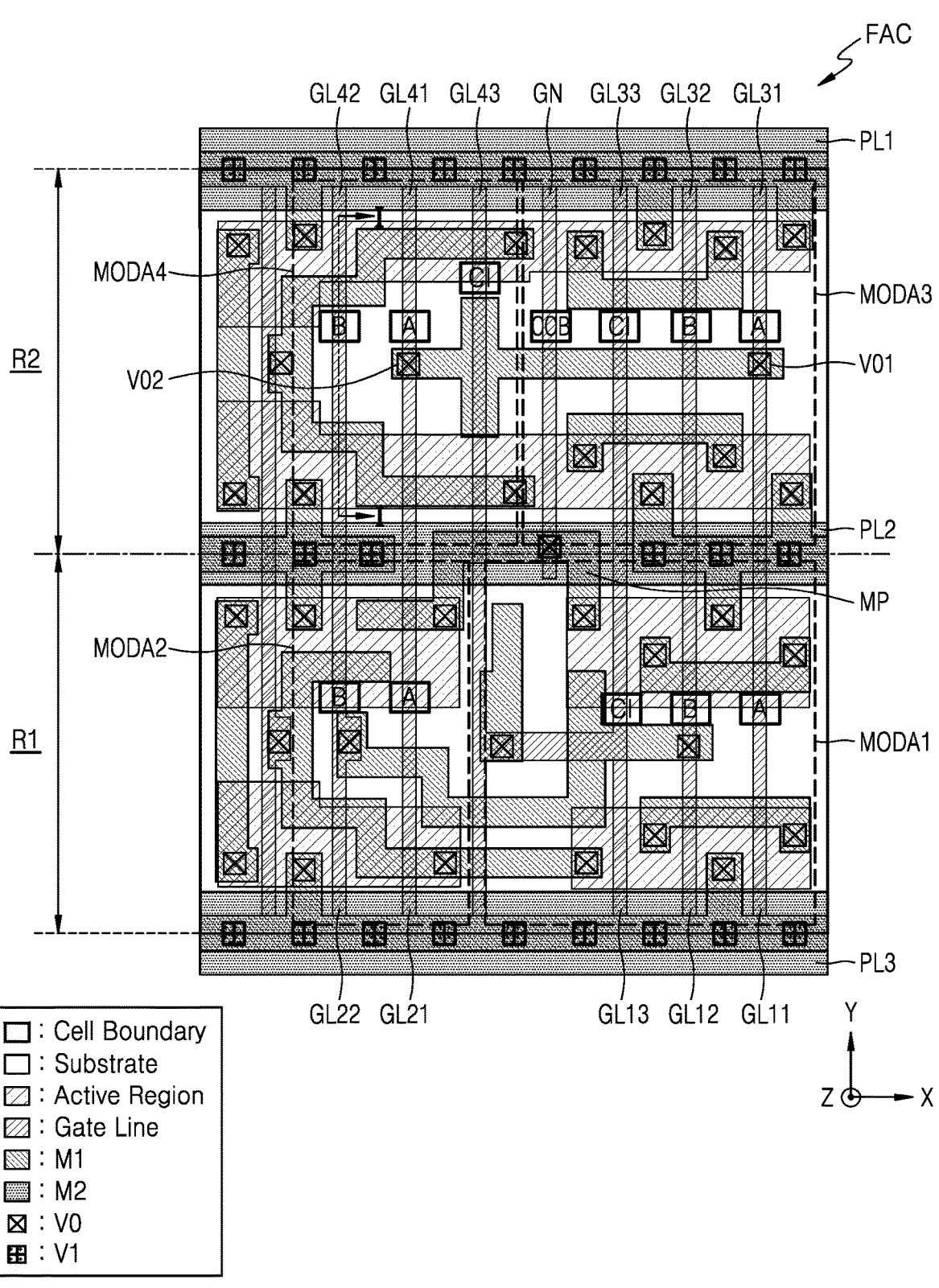
FIG. 4A is a plan view illustrating layout of an integrated circuit including an adder cell according to an exemplary embodiment.
Figure 4B:
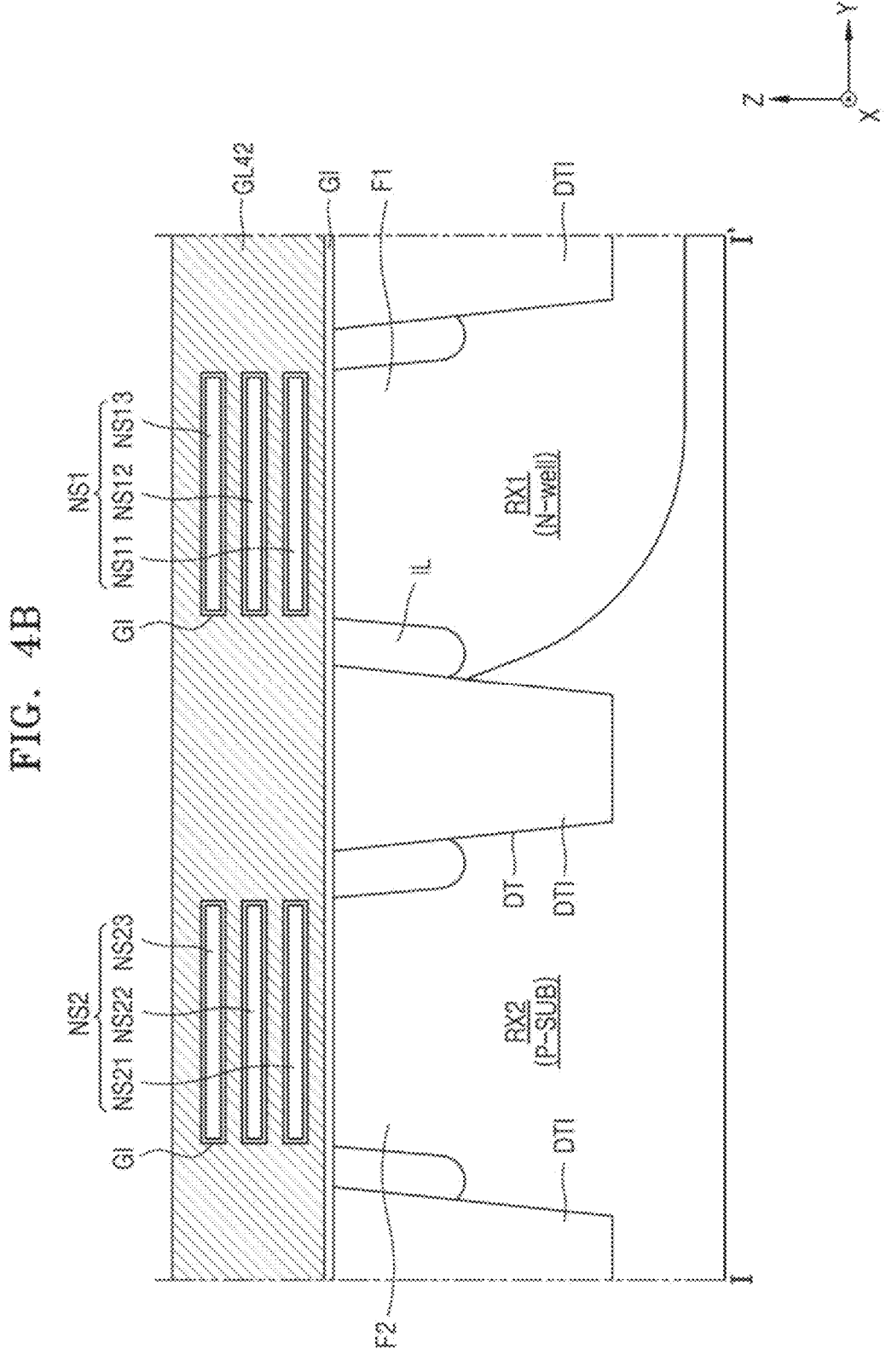
FIG. 4B is a cross-sectional view of an adder cell according to an exemplary embodiment, which is taken along the line I-I' of FIG. 4A.

Referring to FIG. 4A, the adder cell FAC may be defined by a cell boundary and may include a plurality of active areas and a plurality of gate lines formed on a substrate. In an exemplary embodiment, the plurality of active areas extend in the X axis direction and the plurality of gate lines extend in the Y axis direction. However, embodiments are not limited thereto.

A gate line and an active area may form a transistor. In an exemplary embodiment, at least one fin extending in the X axis direction or a nano wire or a nano sheet may be formed on the active area. For example, the gate line and the active area may form a fin field effect transistor (finFET). For example, a gate-all-around (GAA) FET in which the nano wire formed on the active area is surrounded by the gate line may be formed and a vertical GAA FET in which a plurality of nano wires are vertically stacked on the active area and are surrounded by the gate line may be formed. For example, a multi-bridge channel (MBC) FET in which a plurality of nano sheets are stacked on the active area and are surrounded by the gate line may be formed. In addition, for example, a negative capacitance (NC) FET may be formed in the active area. Other than the above-described transistor, various transistors may be formed in the gate line and the active area.

In an exemplary embodiment, the active area may include semiconductor such as silicon (Si) or germanium (Ge) or compound semiconductor such as silicon germanium (SiGe), silicon carbide (SiC), gallium arsenide (GaAs), indium arsenide (InAs), or indium phosphide (InP) and a conductive area, for example, a well doped with impurities or a structure doped with impurities. In an exemplary embodiment, the gate line may include a work function metal-containing layer and a gapfill metal layer. For example, the work function metal-containing layer may include at least one of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd) and the gapfill metal layer may include a W layer or an aluminum (Al) layer. In an exemplary embodiment, the gate line may include a stacked structure of TiAlC/TiN/W, a stacked structure of TiN/TaN/TiAlC/TiN/W, or a stacked structure of TiN/TaN/TiN/TiAlC/TiN/W.

As an example in which the plurality of nano sheets are formed in the active area, referring to FIGS. 4A and 4B, the active area may include a second active area RX2 formed in a substrate P-SUB doped with P type impurities and a first active area RX1 formed in an N-well formed in the substrate P-SUB. A first fin F1 may be formed in the first active area RX1 and a second fin F2 may be formed in the second active area RX2. The first fin F1 and the second fin F2 may extend in parallel in the X axis direction. Between the first fin F1 and an isolation layer DTI and between the second fin F2 and the isolation layer DTI, an insulating layer IL (for example, oxide) may be formed.

An isolation trench DT may be formed between the first active area RX1 and the second active area RX2. The isolation trench DT may be filled with an insulating material (for example, oxide) so that the isolation layer DTI may be formed. The first active area RX1 and the second active area RX2 may be isolated from each other by the isolation layer DTI.

A nano sheet may be formed on each of the first active area RX1 and the second active area RX2. A first nano sheet stack NS1 may be formed on the first active area RX1 and a second nano sheet stack NS2 may be formed on the second active area RX2. The first nano sheet stack NS1 and the second nano sheet stack NS2 may extend in the X axis direction.

The first nano sheet stack NS1 and the second nano sheet stack NS2 may function as channels of transistors. For example, the first nano sheet stack NS1 may be doped with N type impurities and may form a p-channel metal-oxide-semiconductor (PMOS) transistor. On the other hand, the second nano sheet stack NS2 may be doped with P type impurities and may form an n-channel metal-oxide-semi-conductor (NMOS) transistor. In an exemplary embodiment, the first nano sheet stack NS1 and the second nano sheet stack NS2 may include Si, Ge, or SiGe. In an exemplary embodiment, the first nano sheet stack NS1 and the second nano sheet stack NS2 may include InGaAs, InAs, GaSb, InSb, or a combination of the above compounds.

The first nano sheet stack NS1 may include a plurality of nano sheets NS11 to NS13 overlapping directly or indirectly on an upper surface of the first fin F1 in the vertical direction (the Z axis direction) and the second nano sheet stack NS2 may include a plurality of nano sheets NS21 to NS23 overlapping directly or indirectly on an upper surface of the second fin F2 in the vertical direction (the Z axis direction). In the current example, it is illustrated that each of the first nano sheet stack NS1 and the second nano sheet stack NS2 includes three nano sheets. However, embodiments are not limited thereto. For example, each of the first nano sheet stack NS1 and the second nano sheet stack NS2 may include at least two nano sheets and the number of nano sheets is not limited.

A gate line GL42 may surround the plurality of nano sheets NS11 to NS13 and NS21 to NS23 while covering the first nano sheet stack NS1 and the second nano sheet stack NS2 on the first fin F1 and the second fin F2. The plurality of nano sheets NS11 to NS13 and NS21 to NS23 may have a GAA structure in which the plurality of nano sheets NS11 to NS13 and NS21 to NS23 are surrounded by the gate line GL42. A gate insulating layer GI may be interposed between the first nano sheet stack NS1 and the second nano sheet stack NS2 and the gate line GL42. In embodiments, when a gate line is described as surrounding a plurality of nano sheets, this may mean that each of the nano sheets may be fully or partially surrounded by the gate line. For example, the gate line may be in contact with one or more sides of one or more of the plurality of nano sheets, for example being in contact with four sides of each of the nano sheets.

Referring to FIG. 4A again, the integrated circuit 10 may include metal layers stacked in a third direction (Z), for example, the first metal layer M1 and the second metal layer M2. In an exemplary embodiment, a width of a pattern formed in the second metal layer M2 may be greater than a width of a pattern formed in the first metal layer M1. However, embodiments are not limited thereto. The adder cell FAC may include a first via V0 formed in the active area and the gate line. The active area and the gate line may be electrically connected to a pattern of a conductive layer (for example, the first metal layer M1), that is, a metal line through the first via V0.

The patterns formed in the first metal layer M1 and the second metal layer M2 may include metal, conductive metal nitride, metal silicide, or a combination of the above materials. For example, the patterns formed in the first metal layer M1, the second metal layer M2, and a third metal layer M3 may include a conductive material such as W, Mo, Ti, Co, tantalum (Ta), Ni, W silicide, Ti silicide, Co silicide, Ta silicide, or Ni silicide.

The adder cell FAC may include the patterns formed in the first metal layer M1 and the patterns formed in the second metal layer M2 and second vias V1 connecting the first metal layer M1 to the second metal layer M2 between the first metal layer M1 and the second metal layer M2. However, embodiments are not limited thereto and the adder cell FAC may further include patterns formed in the third metal layer M3 that is an upper layer of the second metal layer M2 and a third via connecting the second metal layer M2 to the third metal layer M3 between the second metal layer M2 and the third metal layer M3. The patterns illustrated in FIG. 4A may be parts of the patterns included in the adder cell FAC.

The integrated circuit (for example, integrated circuit 10 of FIG. 3) may include first to third power lines PL1, PL2, and PL3 that extend in the X axis direction and to which the first voltage (for example, VDD of FIG. 2) or the second voltage (for example, VSS of FIG. 2) is applied. In the first to third power lines PL1, PL2, and PL3, power lines to which the first voltage VDD is applied and power lines to which the second voltage VSS is applied may be alternately arranged in the Y axis direction. The adder cell FAC may receive the second voltage VSS from the first power line PL1 and the third power line PL3 and may receive the first voltage VDD from the second power line PL2. In FIG. 4A, an example in which the first to third power lines PL1, PL2, and PL3 form the patterns of the second metal layer M2 is illustrated. However, the integrated circuit according to embodiments is not limited thereto and the first to third power lines PL1, PL2, and PL3 may form the patterns of the first metal layer M1 or may be buried in a substrate The first input signal A may be applied to the first gate lines GL11, GL21, GL31, and GL41 included in the adder cell FAC, the second input signal B may be applied to the second gate lines GL12, GL22, GL32, and GL42, and the carry input signal CI may be applied to the third gate lines GL13, GL33, and GL43.

In an exemplary embodiment, because the first gate lines GL11 and GL31 of the first and third circuit areas MODA1 and MODA3 form one gate line pattern and the first gate lines GL21 and GL41 of the second and fourth circuit areas MODA2 and MODA4 form one gate line pattern, the adder cell FAC may include a first via V01 connected to the first gate lines GL11 and GL31 and a first via V02 connected to the first gate lines GL21 and GL41. In embodiments, first vias V01 and V02 may each be an example of a first via V0. In embodiments different from the embodiment illustrated in FIG. 4A, when the first gate lines GL11, GL21, GL31, and GL41 formed in the first to fourth circuit areas MODA1 and MODA4 are connected to form one gate line pattern, the number of first vias connected to the first gate lines GL11, GL21, GL31, and GL41 may be one.

In an exemplary embodiment, the first vias V01 and V02 connected to the first gate lines GL11, GL21, GL31, and GL41 formed in the first to fourth circuit areas MODA1 and MODA4 may be arranged in one of the first row R1 and the second row R2. For example, the first vias V01 and V02 may be arranged in the second row R2.

Description of the number of first vias V01 and V02 connected to the first gate lines GL11, GL21, GL31, and GL41 may also be applied to the second gate lines GL12, GL22, GL32, and GL42 and the third gate lines GL13, GL33, and GL43. That is, because the second gate lines GL12 and GL32 of the first and third circuit areas MODA1 and MODA3 form one gate line pattern and the second gate lines GL22 and GL42 of the second and fourth circuit areas MODA2 and MODA4 form one gate line pattern, in the adder cell FAC according to some embodiments the number of first vias connected to the second gate lines GL12, GL22, GL32, and GL42 may be no more than 2. In an exemplary embodiment, in the adder cell FAC, the first vias connected to the second gate lines GL12, GL22, GL32, and GL42 may be arranged in one of the first row R1 and the second row R2.

In an exemplary embodiment, the inverted signal COB (for example, a voltage of the first node N1 of FIG. 2) of the carry output signal (for example, CO of FIG. 2) output from the first circuit area MODA1 and the second circuit area MODA2 may be applied to the third circuit area MODA3 through the pattern MP of the first metal layer M1 and the gate line GN.

In the adder cell FAC according to embodiments, the first gate lines GL11 and GL21 formed in the first row R1 and the first gate lines GL31 and GL41 formed in the second row R2 may be aligned in the Y axis direction, the second gate lines GL12 and GL22 formed in the first row R1 and the second gate lines GL32 and GL42 formed in the second row R2 may be aligned in the Y axis direction, or the third gate line GL13 formed in the first row R1 and the third gate lines GL33 and GL43 formed in the second row R2 may be aligned in the Y axis direction. By aligning the gate lines to which the same signal is input in different circuit areas in the Y axis direction, although additional metal lines are not formed, by extending the gate lines, the same signal may be input to different circuit areas. That is, a wiring-length of the pattern (for example, the metal line) of the first metal layer M1 or the second metal layer M2 formed, in order to connect the transistors formed in the adder cell FAC to one another or to apply the first input signal A, the second input signal B, and the carry input signal CI to the transistors, in the adder cell FAC may be reduced. Therefore, capacitance of input/output pins formed in the adder cell FAC and cell delay of the adder cell FAC may be reduced. In addition, power consumption of the integrated circuit (for example, integrated circuit 10 of FIG. 3) including the adder cell FAC may be reduced.

Figure 5:
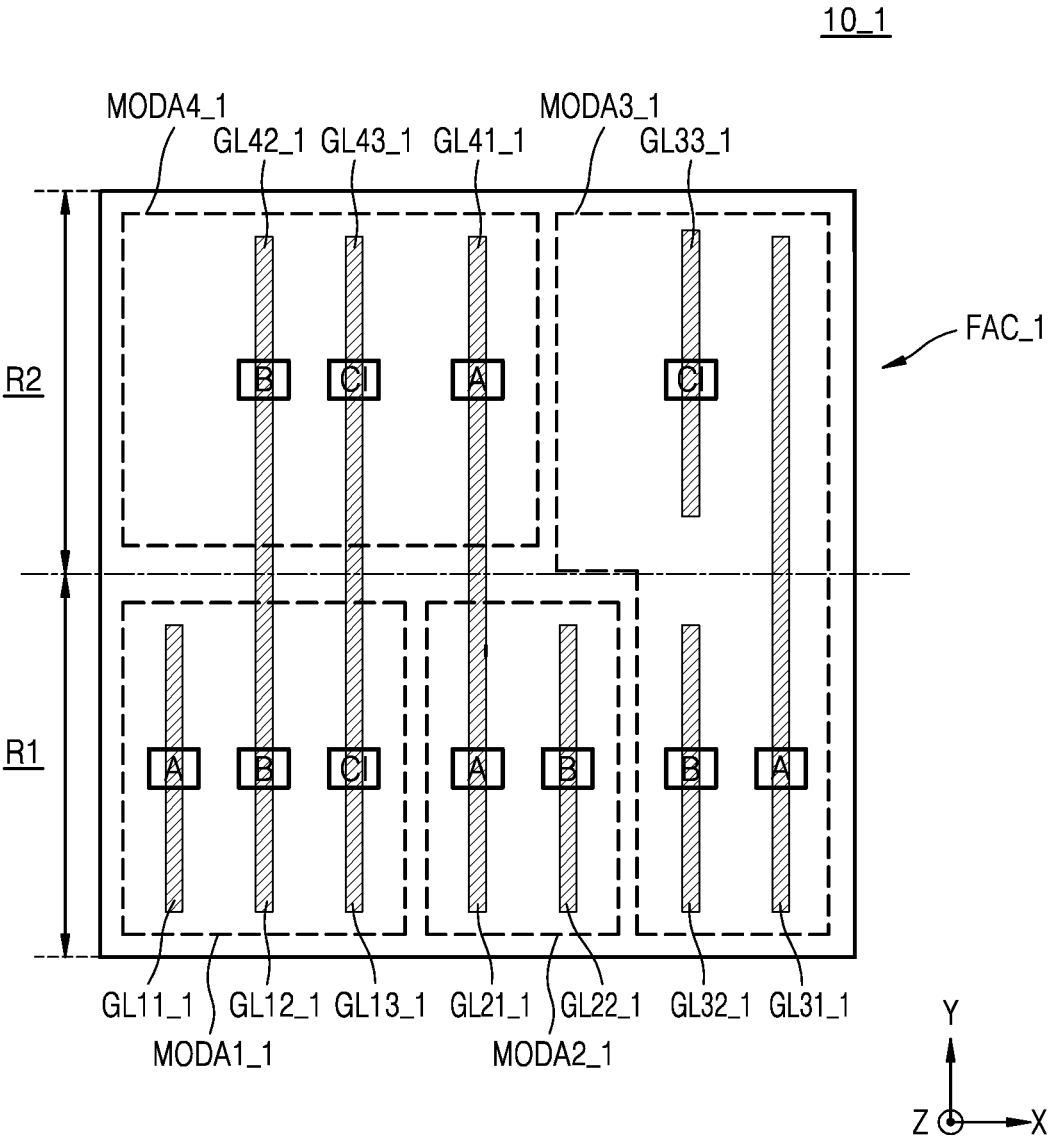
FIGS. 5 to 8 are plan views illustrating layouts of integrated circuits including adder cells according to an exemplary embodiment.

FIG. 5 is a plan view illustrating layout of an integrated circuit 10_1 including an adder cell FAC_1 according to an exemplary embodiment.

Referring to FIG. 5, the adder cell FAC_1 may include a first circuit area MODA1_1 in which the first circuit (for example, MOD1 of FIG. 2) is formed, a second circuit area MODA2_1 in which the second circuit (for example, MOD2 of FIG. 2) is formed, a third circuit area MODA3_1 in which the third circuit (for example, MOD3 of FIG. 2) is formed, and a fourth circuit area MODA4_1 in which the fourth circuit (for example, MOD4 of FIG. 2) is formed. The first circuit area MODA1_1 may include a first gate line GL11_1 to which the first input signal A is applied, a second gate line GL12_1 to which the second input signal B is applied, and a third gate line GL13_1 to which the carry input signal CI is applied. The second circuit area MODA2_1 may include a first gate line GL21_1 to which the first input signal A is applied and a second gate line GL22_1 to which the second input signal B is applied. The third circuit area MODA3_1 may include a first gate line GL31_1 to which the first input signal A is applied, a second gate line GL32_1 to which the second input signal B is applied, and a third gate line GL33_1 to which the carry input signal CI is applied. The fourth circuit area MODA4_1 may include a first gate line GL41_1 to which the first input signal A is applied, a second gate line GL42_1 to which the second input signal B is applied, and a third gate line GL43_1 to which the carry input signal CI is applied. Each of the first to third gate lines GL11_1, GL12_1, GL13_1, the first to second gate lines GL21_1, GL22_1, the first to third gate lines GL31_1, GL32_1, GL33_1, and the first to third gate lines GL41_1, GL42_1, and GL43_1 may form a gate line pattern extending in the Y axis direction.

The adder cell FAC_1 may be arranged in a first row R1 and a second row R2. In an exemplary embodiment, the first circuit area MODA1_1 and the second circuit area MODA2_1 may be arranged in the first row R1 and the fourth circuit area MODA4_1 may be arranged in the second row R2. The third circuit area MODA3_1 may be arranged in the first row R1 and the second row R2.

In an exemplary embodiment, at least one of the first gate lines GL11_1 and GL21_1 formed in the first circuit area MODA1_1 and the second circuit area MODA2_1 arranged in the first row R1 may be aligned in the Y axis direction with the first gate line GL41_1 formed in the fourth circuit area MODA4_1 arranged in the second row R2. For example, the first gate line GL21_1 of the second circuit area MODA2_1 and the first gate line GL41_1 of the fourth circuit area MODA4_1 may be aligned in the Y axis direction. In addition, for example, the first gate line GL21_1 of the second circuit area MODA2_1 and the first gate line GL41_1 of the fourth circuit area MODA4_1 may form one gate line pattern. The adder cell FAC_1 according to embodiments is not limited thereto and the first gate line GL21_1 of the second circuit area MODA2_1 and the GL41_1 of the fourth circuit area MODA4_1 may respectively form separate gate line patterns aligned in the Y axis direction.

In an exemplary embodiment, at least one of the second gate lines GL12_1 and GL22_1 formed in the first circuit area MODA1_1 and the second circuit area MODA2_1 arranged in the first row R1 may be aligned in the Y axis direction with the second gate line GL42_1 formed in the fourth circuit area MODA4_1 arranged in the second row R2. For example, the second gate line GL12_1 of the first circuit area MODA1_1 and the second gate line GL42_1 of the fourth circuit area MODA4_1 may be aligned in the Y axis direction. In addition, for example, the second gate line GL12_1 of the first circuit area MODA1_1 and the second gate line GL42_1 of the fourth circuit area MODA4_1 may form one gate line pattern. The adder cell FAC_1 according to embodiments is not limited thereto and the second gate line GL12_1 of the first circuit area MODA1_1 and the second gate line GL42_1 of the fourth circuit area MODA4_1 may respectively form separate gate line patterns aligned in the Y axis direction.

In an exemplary embodiment, the third gate line GL13_1 formed in the first circuit area MODA1_1 arranged in the first row R1 may be aligned in the Y axis direction with the third gate line GL43_1 formed in the fourth circuit area MODA4_1 arranged in the second row R2. For example, the third gate line GL13_1 formed in the first circuit area MODA1_1 and the third gate line GL43_1 formed in the fourth circuit area MODA4_1 may form one gate line pattern. The adder cell FAC_1 according to embodiments is not limited thereto and the third gate line GL13_1 formed in the first circuit area MODA1_1 and the third gate line GL43_1 formed in the fourth circuit area MODA4_1 may respectively form separate gate line patterns aligned in the Y axis direction.

Figure 6:
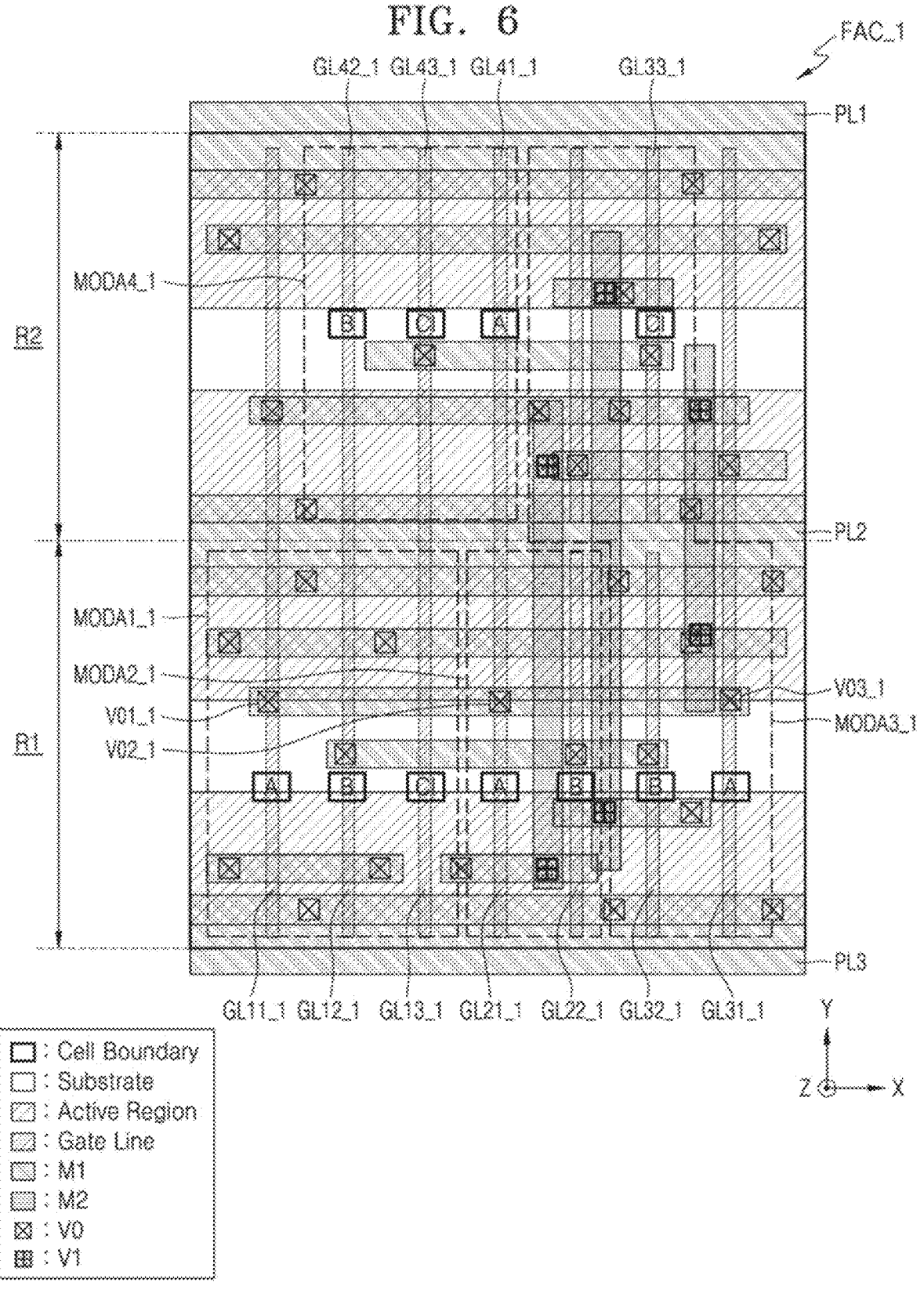

FIG. 6 is a plan view illustrating layout of an adder cell according to an exemplary embodiment, which is a detailed example of the adder cell illustrated in FIG. 5. Description previously given with reference to FIG. 4A will not be given in FIG. 6.

Referring to FIG. 6, the first input signal A may be applied to the first gate lines GL11_1, GL21_1, GL31_1, and GL41_1 included in the adder cell FAC_1, the second input signal B may be applied to the second gate lines GL12_1, GL22_1, GL32_1, and GL42_1, and the carry input signal CI may be applied to the third gate lines GL13_1, GL33_1, and GL43_1.

In an exemplary embodiment, because the first gate lines GL21_1 and GL41_1 of the second and fourth circuit areas MODA2_1 and MODA4_1 form one gate line pattern, the adder cell FAC_1 may include three first vias V01_1, V02_1, and V03_1 connected to the first gate lines GL11_1, GL21_1, GL31_1, and GL41_1. In embodiments, first vias V01_1, V02_1, and V03_1 may each be an example of a first via V0. In embodiments different from the embodiment illustrated in FIG. 6, when all of the first gate lines GL11_1, GL21_1, GL31_1, and GL41_1 formed in the first to fourth circuit areas MODA1_1 to MODA4_1 are connected to one another to form one gate line pattern, or some of the first gate lines GL11_1, GL21_1, GL31_1, and GL41_1 formed in the first to fourth circuit areas MODA1_1 to MODA4_1 are connected to one another to form one gate line pattern, the number of first vias connected to the first gate lines GL11_1, GL21_1, GL31_1, and GL41_1 may be 1 or 2.

In an exemplary embodiment, the first vias V01_1, V02_1, and V03_1 connected to the first gate lines GL11_1, GL21_1, GL31_1, and GL41_1 formed in the first to fourth circuit areas MODA1_1 to MODA4_1 may be arranged in one of the first row R1 and the second row R2. For example, the first vias V01_1, V02_1, and V03_1 may be arranged in the first row R1.

Description of the number of first vias V01_1, V02_1, and V03_1 connected to the first gate lines GL11_1, GL21_1, GL31_1, and GL41_1 may also be applied to the second gate lines GL12_1, GL22_1, GL32_1, and GL42_1 and the third gate lines GL13_1, GL33_1, and GL43_1. In the adder cell FAC_1 according to some embodiments, the number of first vias connected to the second gate lines GL12_1, GL22_1, GL32_1, and GL42_1 may be no more than 3. In an exemplary embodiment, in the adder cell FAC_1, the first vias connected to the second gate lines GL12_1, GL22_1, GL32_1, and GL42_1 may be arranged in one of the first row R1 and the second row R2.

Figure 7:
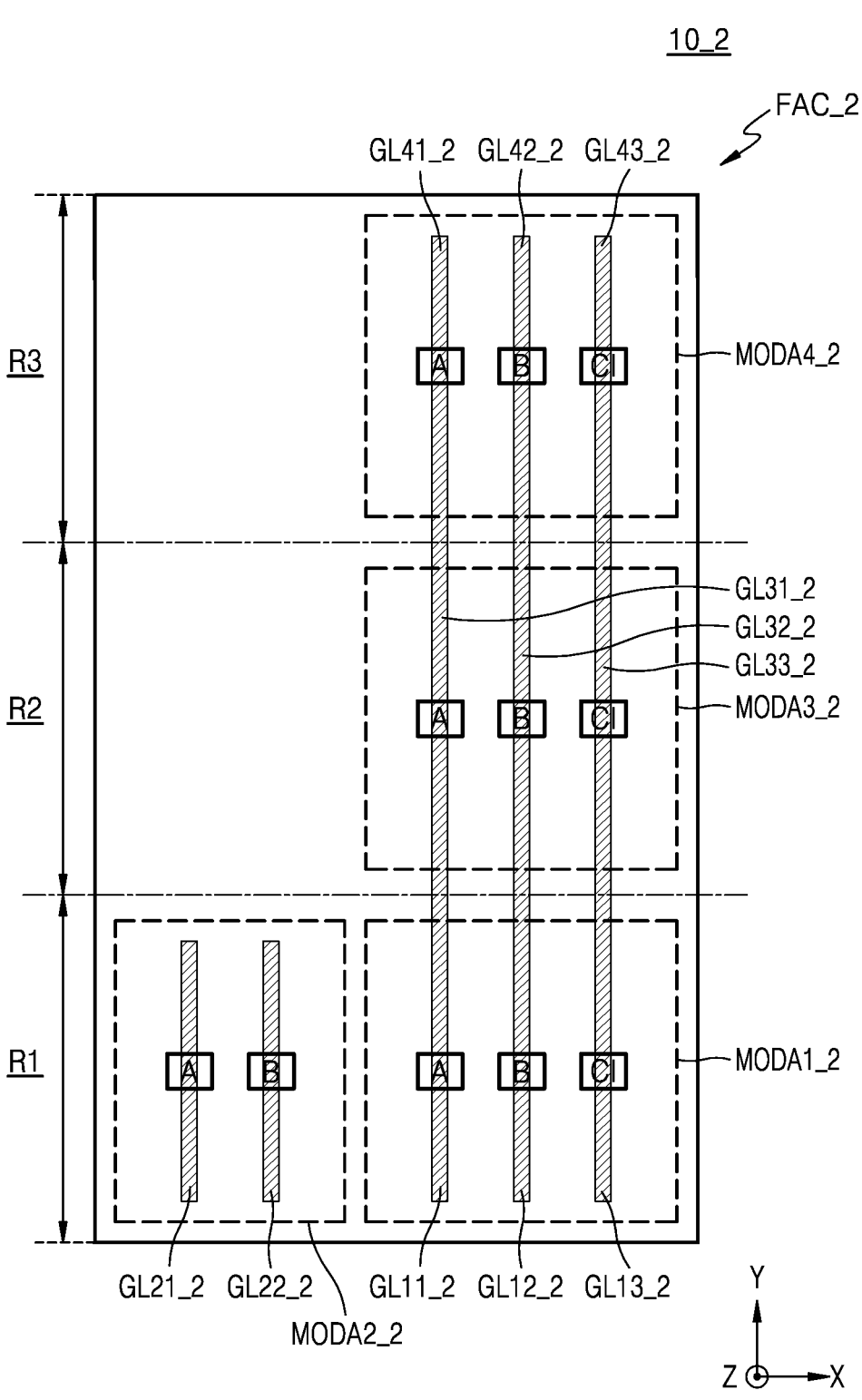
Figure 8:
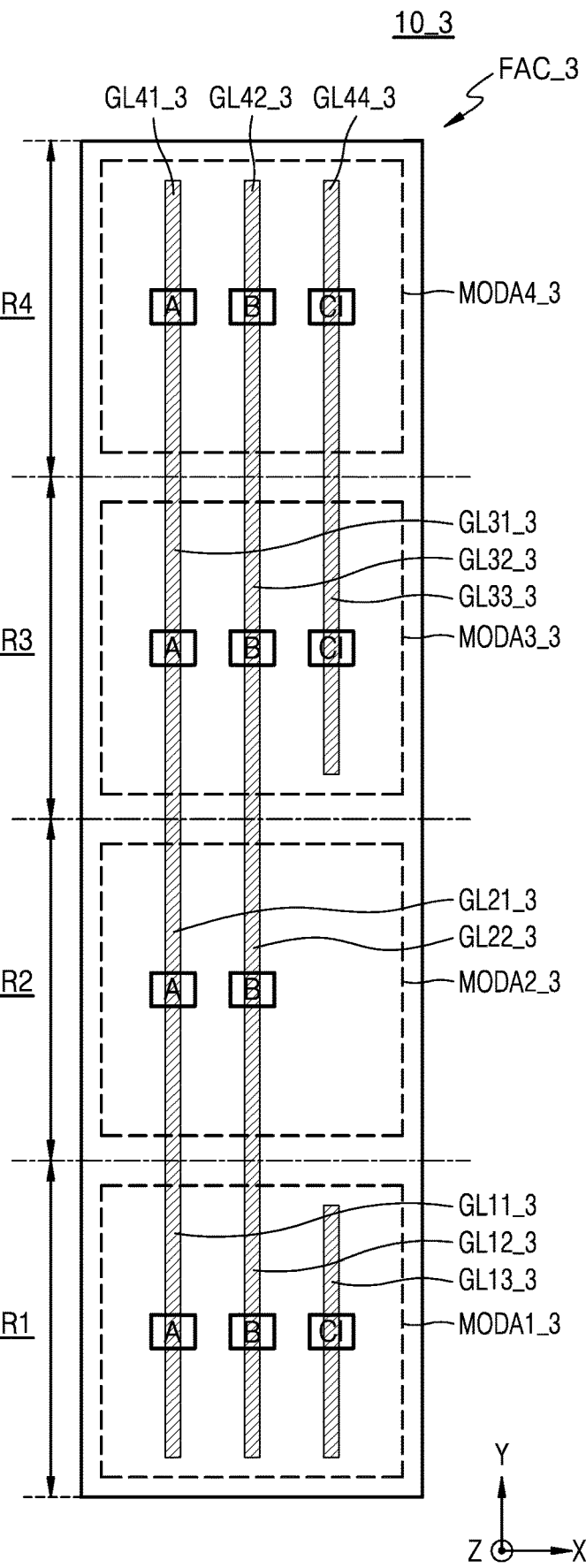

FIG. 7 is a plan view illustrating a layout of integrated circuit 10_2, and FIG. 8 is a plan view illustrating a layout of integrated circuit 10_3 including adder cell FAC_3 according to an exemplary embodiments.

Referring to FIG. 7, the adder cell FAC_2 included in the integrated circuit 10_2 may include a first circuit area MODA1_2 in which the first circuit (for example, MOD1 of FIG. 2) is formed, a second circuit area MODA2_2 in which the second circuit (for example, MOD2 of FIG. 2) is formed, a third circuit area MODA3_2 in which the third circuit (for example, MOD3 of FIG. 2) is formed, and a fourth circuit area MODA4_2 in which the fourth circuit (for example, MOD4 of FIG. 2) is formed. The first circuit area MODA1_2 may include a first gate line GL11_2 to which the first input signal A is applied, a second gate line GL12_2 to which the second input signal B is applied, and a third gate line GL13_2 to which the carry input signal CI is applied and the second circuit area MODA2_2 may include a first gate line GL21_2 to which the first input signal A is applied and a second gate line GL22_2 to which the second input signal B is applied. The third circuit area MODA3_2 may include a first gate line GL31_2 to which the first input signal A is applied, a second gate line GL32_2 to which the second input signal B is applied, and a third gate line GL33_2 to which the carry input signal CI is applied. The fourth circuit area MODA4_2 may include a first gate line GL41_2 to which the first input signal A is applied, a second gate line GL42_2 to which the second input signal B is applied, and a third gate line GL43_2 to which the carry input signal CI is applied.

The adder cell FAC_2 may be arranged in first to third rows R1 to R3 adjacent to one another. In an exemplary embodiment, the first circuit area MODA1_2 and the second circuit area MODA2_2 may be arranged in the first row R1, the third circuit area MODA3_2 may be arranged in the second row R2, and the fourth circuit area MODA4_2 may be arranged in the third row R3. The first to third rows R1 to R3 may be adjacent to one another and heights of the first to third rows R1 to R3 in the Y axis direction may be equal to or different from one another and may vary.

In an exemplary embodiment, at least one of the first gate lines GL11_2 and GL21_2 formed in the first circuit area MODA1_2 and the second circuit area MODA2_2 arranged in the first row R1 may be aligned in the Y axis direction with the first gate line GL31_2 formed in the third circuit area MODA3_2 arranged in the second row R2. In addition, in an exemplary embodiment, the first gate line GL31_2 formed in the third circuit area MODA3_2 arranged in the second row R2 may be aligned in the Y axis direction with the first gate line GL41_2 formed in the fourth circuit area MODA4_2 arranged in the third row R3. For example, the first gate line GL11_2 of the first circuit area MODA1_2, the first gate line GL31_2 of the third circuit area MODA3_2, and the first gate line GL41_2 of the fourth circuit area MODA4_2 may be aligned in the Y axis direction. In addition, for example, at least some of the first gate line GL11_2 of the first circuit area MODA1_2, the first gate line GL31_2 of the third circuit area MODA3_2, and the first gate line GL41_2 of the fourth circuit area MODA4_2 may form one gate line pattern. The adder cell FAC_2 according to embodiments is not limited thereto and the first gate line GL11_2 of the first circuit area MODA1_2, the first gate line GL31_2 of the third circuit area MODA3_2, and the first gate line GL41_2 of the fourth circuit area MODA4_2 may respectively form separate gate line patterns aligned in the Y axis direction.

In an exemplary embodiment, at least one of the second gate lines GL12_2 and GL22_2 formed in the first circuit area MODA1_2 and the second circuit area MODA2_2 arranged in the first row R1 may be aligned in the Y axis direction with the second line GL32_2 formed in the third circuit area MODA3_2 arranged in the second row R2. In addition, in an exemplary embodiment, the second line GL32_2 formed in the third circuit area MODA3_2 arranged in the second row R2 may be aligned in the Y axis direction with the second gate line GL42_2 formed in the fourth circuit area MODA4_2 arranged in the third row R3. For example, the second gate line GL12_2 of the first circuit area MODA1_2, the second gate line GL32_2 of the third circuit area MODA3_2, and the second gate line GL42_2 of the fourth circuit area MODA4_2 may be aligned in the Y axis direction. In addition, for example, at least some of the second gate line GL12_2 of the first circuit area MODA1_2, the second gate line GL32_2 of the third circuit area MODA3_2, and the second gate line GL42_2 of the fourth circuit area MODA4_2 may form one gate line pattern. The adder cell FAC_2 according to embodiments is not limited thereto and the second gate line GL12_2 of the first circuit area MODA1_2, the second gate line GL32_2 of the third circuit area MODA3_2, and the second gate line GL42_2 of the fourth circuit area MODA4_2 may respectively form separate gate line patterns aligned in the Y axis direction.

In an exemplary embodiment, some of the third gate line GL13_2 formed in the first circuit area MODA1_2 arranged in the first row R1, the third gate line GL33_2 formed in the third circuit area MODA3_2 arranged in the second row R2, and the third gate line GL43_2 formed in the fourth circuit area MODA4_2 arranged in the third row R3 may be aligned in the Y axis direction. For example, at least some of the third gate lines GL13_2, GL33_2, and GL43_2 may form one gate line pattern. The adder cell FAC_2 according to embodiments is not limited thereto and the third gate lines GL13_2, GL33_2, and GL43_2 may respectively form separate gate line patterns aligned in the Y axis direction.

In an exemplary embodiment, the adder cell FAC_2 may include no more than three first vias connected to the first gate lines GL11_2, GL21_2, GL31_2, and GL41_2 and the first vias may be arranged in one of the first to third rows R1 to R3. In addition, in an exemplary embodiment, the adder cell FAC_2 may include no more than three first vias connected to the second gate lines GL12_2, GL22_2, GL32_2, and GL42_2 and the first vias may be arranged in one of the first to third rows R1 to R3. In addition, in an exemplary embodiment, the adder cell FAC_2 may include no more than three first vias connected to the third gate lines GL13_2, GL33_2, and GL43_2 and the first vias may be arranged in one of the first to third rows R1 to R3.

Referring to FIG. 8, the adder cell FAC_3 included in the integrated circuit 10_3 may include a first circuit area MODA1_3 in which the first circuit (for example, MOD1 of FIG. 2) is formed, a second circuit area MODA2_3 in which the second circuit (for example, MOD2 of FIG. 2) is formed, a third circuit area MODA3_3 in which the third circuit (for example, MOD3 of FIG. 2) is formed, and a fourth circuit area MODA4_3 in which the fourth circuit (for example, MOD4 of FIG. 2) is formed. The first circuit area MODA1_3 may include a first gate line GL11_3 to which the first input signal A is applied, a second gate line GL12_3 to which the second input signal B is applied, and a third gate line GL13_3 to which the carry input signal CI is applied. The second circuit area MODA2_3 may include a first gate line GL21_3 to which the first input signal A is applied and a second gate line GL22_3 to which the second input signal B is applied. The third circuit area MODA3_3 may include a first gate line GL31_3 to which the first input signal A is applied, a second gate line GL32_3 to which the second input signal B is applied, and a third gate line GL33_3 to which the carry input signal CI is applied. The fourth circuit area MODA4_3 may include a first gate line GL41_3 to which the first input signal A is applied, a second gate line GL42_3 to which the second input signal B is applied, and a third gate line GL43_3 to which the carry input signal CI is applied.

The adder cell FAC_3 may be arranged in first to fourth rows R1 to R4 adjacent to one another. In an exemplary embodiment, the first circuit area MODA1_3 may be arranged in the first row R1, the second circuit area MODA2_3 may be arranged in the second row R2, the third circuit area MODA3_3 may be arranged in the third row R3, and the fourth circuit area MODA4_3 may be arranged in the fourth row R4. The first to fourth rows R1 to R4 may be adjacent to one another and heights of the first to fourth rows R1 to R4 in the Y axis direction may be equal to or different from one another and may vary.

In an exemplary embodiment, at least some of the first gate line GL11_3 formed in the first circuit area MODA1_3, the first gate line GL21_3 formed in the second circuit area MODA2_3, the first gate line GL31_3 formed in the third circuit area MODA3_3, and the first gate line GL41_3 formed in the fourth circuit area MODA4_3 may be aligned in the Y axis direction. In an exemplary embodiment, the first gate line GL11_3 formed in the first circuit area MODA1_3, the first gate line GL21_3 formed in the second circuit area MODA2_3, the first gate line GL31_3 formed in the third circuit area MODA3_3, and the first gate line GL41_3 formed in the fourth circuit area MODA4_3 may be aligned. At least some of the first gate line GL11_3 formed in the first circuit area MODA1_3, the first gate line GL21_3 formed in the second circuit area MODA2_3, the first gate line GL31_3 formed in the third circuit area MODA3_3, and the first gate line GL41_3 formed in the fourth circuit area MODA4_3 may form one gate line pattern. The adder cell FAC_3 according to embodiments is not limited thereto and the first gate line GL11_3 formed in the first circuit area MODA1_3, the first gate line GL21_3 formed in the second circuit area MODA2_3, the first gate line GL31_3 formed in the third circuit area MODA3_3, and the first gate line GL41_3 formed in the fourth circuit area MODA4_3 may respectively form separate gate line patterns aligned in the Y axis direction.

In an exemplary embodiment, some of the second gate line GL12_3 formed in the first circuit area MODA1_3, the second gate line GL22_3 formed in the second circuit area MODA2_3, the second gate line GL32_3 formed in the third circuit area MODA3_3, and the second gate line GL42_3 formed in the fourth circuit area MODA4_3 may be aligned in the Y axis direction. For example, at least some of the second gate lines GL12_3, GL22_3, GL32_3, and GL42_3 may form one gate line pattern. The adder cell FAC_3 according to embodiments is not limited thereto and the second gate lines GL12_3, GL22_3, GL32_3, and GL42_3 may respectively form separate gate line patterns aligned in the Y axis direction.

In an exemplary embodiment, some of the third gate line GL13_3 formed in the first circuit area MODA1_3, the third gate line GL33_3 formed in the third circuit area MODA3_3, and the third gate line GL43_3 formed in the fourth circuit area MODA4_3 may be aligned in the Y axis direction. For example, at least some of the third gate lines GL13_3, GL33_3, and GL43_3 may form one gate line pattern. The adder cell FAC_3 according to embodiments is not limited thereto and the third gate lines GL13_3, GL33_3, and GL43_3 may respectively form separate gate line patterns aligned in the Y axis direction.

In an exemplary embodiment, the adder cell FAC_3 may include no more than three first vias connected to the first gate lines GL11_3, GL21_3, GL31_3, and GL41_3 and the first vias may be arranged in one the first to fourth rows R1 to R4. In addition, in an exemplary embodiment, the adder cell FAC_3 may include no more than three first vias connected to the second gate lines GL12_3, GL22_3, GL32_3, and GL42_3 and the first vias may be arranged in one the first to fourth rows R1 to R4. In addition, in an exemplary embodiment, the adder cell FAC_3 may include no more than three first vias connected to the third gate lines GL13_3, GL33_3, and GL43_3 and the first vias may be arranged in one the first to fourth rows R1 to R4.

Figure 9:
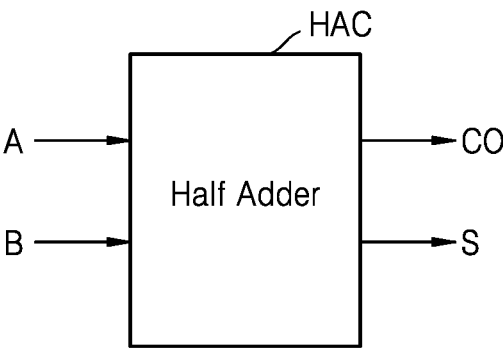
FIG. 9 is a block diagram of an adder cell according to an exemplary embodiment.
Figure 10:
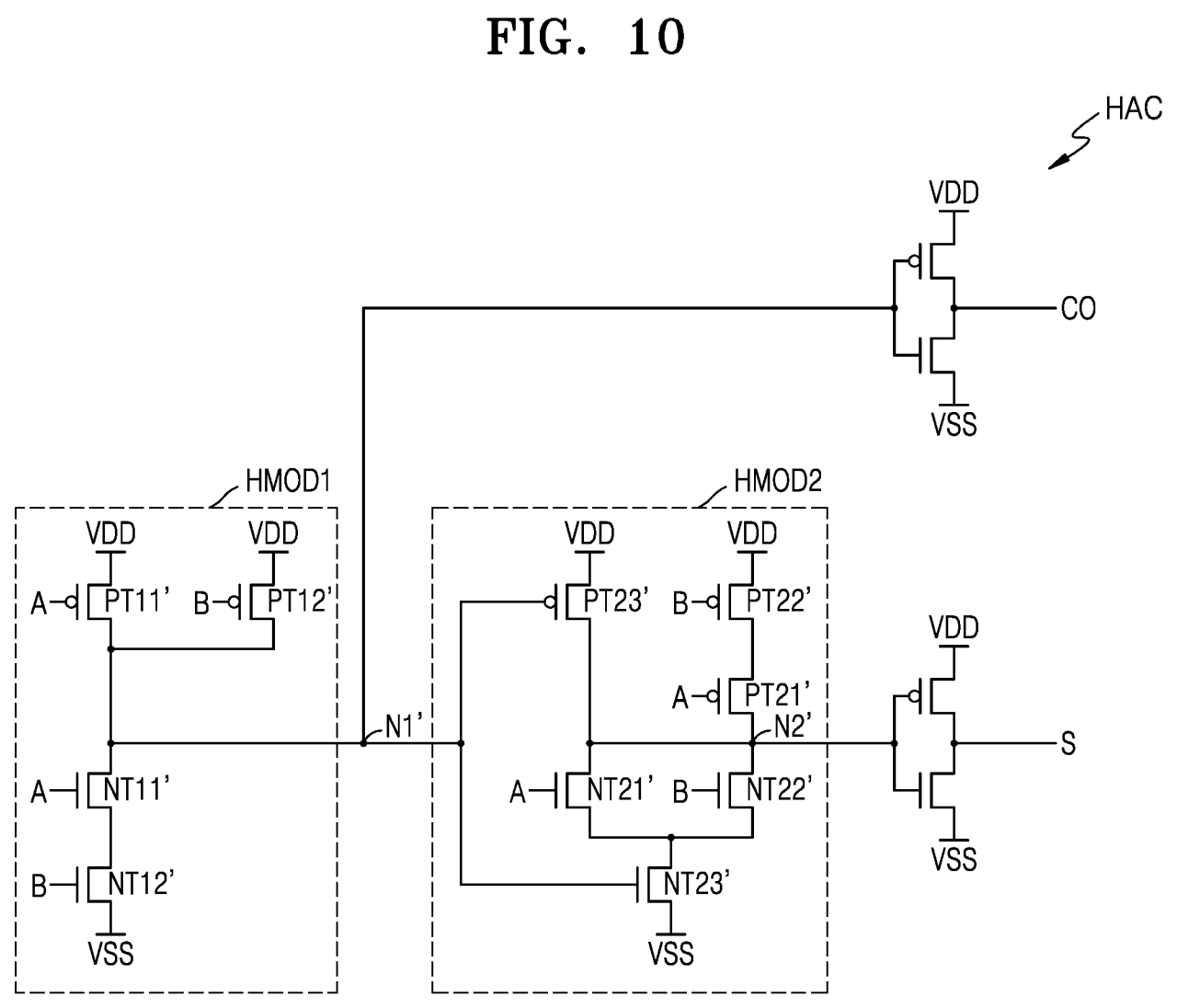

FIG. 9 is a block diagram of an adder cell HAC according to an exemplary embodiment and FIG. 10 is a circuit diagram of an adder cell according to an exemplary embodiment.

Referring to FIG. 9, the adder cell HAC may be a half adder cell and a circuit formed in the adder cell HAC may be a logic combination circuit calculating the sum of two input bits. The adder cell HAC may receive the first input signal A and the second input signal B and may output the sum signal S and the carry output signal CO through the first input signal A and the second input signal B.

Referring to FIGS. 9 and 10, the adder cell HAC may include a first circuit HMOD1 and a second circuit HMOD2 and may further include an inverter connected to a first node N1' and outputting the carry output signal CO and an inverter connected to a second node N2' and outputting the sum signal S. The first circuit HMOD1 and the second circuit HMOD2 may respectively receive the first input signal A and the second input signal B and may respectively output a first output and a second output. In embodiments, the first circuit HMOD1 may output the first output, and the second circuit HMOD2 may output the second output. The first output and the second output may be calculated as follows. COB may mean an inverted signal of the carry output signal CO.

$$\text{First output} = \overline{AB}$$

$$\text{Second output} = COB(A+B)AB$$

The first circuit HMOD1 may include a first P type transistor PT11' to a gate end of which the first input signal A is input, a second P type transistor PT12' to a gate end of which the second input signal B is input, a first N type transistor NT11' to a gate end of which the first input signal A is input, and a second N type transistor NT12' to a gate end of which the second input signal B is input.

The first voltage VDD may be applied to a first end of each of the first P type transistor PT11' and the second P type transistor PT12' and a second end of each of the first P type transistor PT11' and the second P type transistor PT12' may be connected to the first node N1'. The second voltage VSS may be applied to the first end of the second N type transistor NT12' and the second end of the second N type transistor NT12' may be connected to the first N type transistor NT11'. The first end of the first N type transistor NT11' may be connected to the second N type transistor NT12' and the second end of the first N type transistor NT11' may be connected to the first node N1'.

The second circuit HMOD2 may include a first P type transistor PT21' to a gate end of which the first input signal A is input, a second P type transistor PT22' to a gate end of which the second input signal B is input, and a third P type transistor PT23' of which gate end is connected to the first node N1'. In addition, the second circuit HMOD2 may include a first N type transistor NT21' to a gate end of which the first input signal A is input, a second N type transistor NT22' to a gate end of which the second input signal B is input, and a third N type transistor NT23' of which gate end is connected to the first node N1'.

A first end of the first P type transistor PT21' may be connected to the second P type transistor PT22' and a second end of the first P type transistor PT21' may be connected to the second node N2'. The first voltage VDD may be applied to a first end of each of the second P type transistor PT22' and the third P type transistor PT23', a second end of the second P type transistor PT22' may be connected to the first P type transistor PT21', and a second end of the third P type transistor PT23' may be connected to the second node N2'.

A first end of each of the first N type transistor NT21' and the second N type transistor NT22' may be connected to the third N type transistor NT23' and a second end of each of the first N type transistor NT21' and the second N type transistor NT22' may be connected to the second node N2'. The second voltage VSS may be applied to a first end of the third N type transistor NT23' and the second end of the third N type transistor NT23' may be connected to the first N type transistor NT21' and the second N type transistor NT22'.

Therefore, the adder cell HAC may include seven P type transistors and seven N type transistors, that is, 14 transistors. The transistors included in the adder cell HAC may be arranged in a first or second column of the adder cell HAC. Examples of arrangement of the transistors included in the adder cell HAC will be described below with reference to FIGS. 11 and 12.

Figure 11:
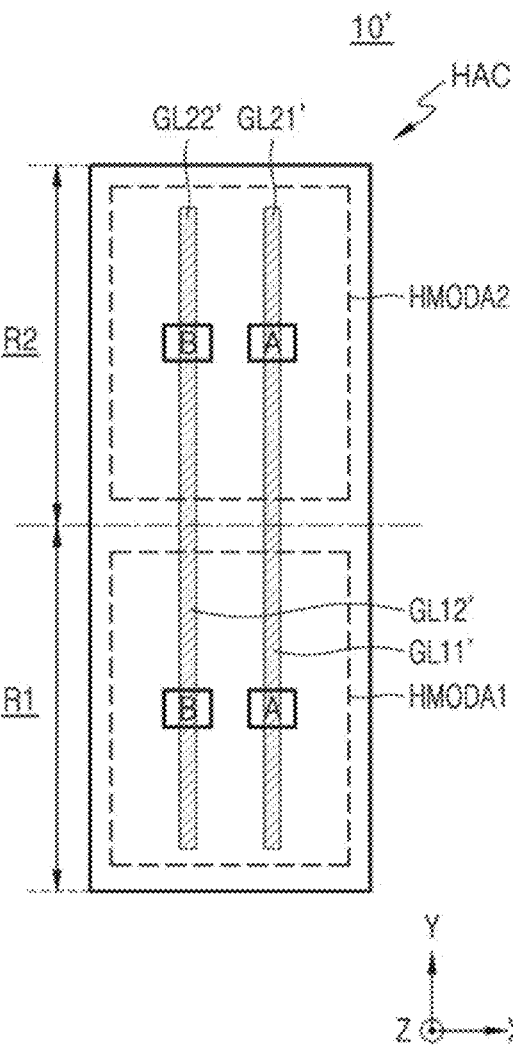
FIGS. 11 and 12 are plan views illustrating layouts of integrated circuits including adder cells according to an exemplary embodiment.

FIG. 11 is a plan view illustrating layout of an integrated circuit 10' including an adder cell HAC according to an exemplary embodiment.

Referring to FIG. 11, the adder cell HAC included in the integrated circuit 10' may include a first circuit area HMODA1 in which the first circuit (for example, HMOD1 of FIG. 10) is formed and a second circuit area HMODA2 in which the second circuit (for example, HMOD2 of FIG. 10) is formed. The first circuit area HMODA1 may include a first gate line GL11' to which the first input signal A is applied and a second gate line GL12' to which the second input signal B is applied and the second circuit area HMODA2 may include a first gate line GL21' to which the first input signal A is applied and a second gate line GL22' to which the second input signal B is applied. Each of the first and second gate lines GL11', GL12', GL21', and GL22' may form a gate line pattern extending in the Y axis direction.

The adder cell HAC may be arranged in the first row R1 and the second row R2. In an exemplary embodiment, the first circuit area HMODA1 may be arranged in the first row R1 and the second circuit area HMODA2 may be arranged in the second row R2. The first row R1 and the second row R2 may be adjacent to each other.

In an exemplary embodiment, the first gate line GL11' of the first circuit area HMODA1 and the first gate line GL21' of the second circuit area HMODA2 may be aligned in the Y axis direction and the second gate line GL12' of the first circuit area HMODA1 and the second gate line GL22' of the second circuit area HMODA2 may be aligned in the Y axis direction. For example, the first gate line GL11' of the first circuit area HMODA1 and the first gate line GL21' of the second circuit area HMODA2 may form one gate line pattern and the second gate line GL12' of the first circuit area HMODA1 and the second gate line GL22' of the second circuit area HMODA2 may form one gate line pattern. That is, the first gate line GL11' of the first circuit area HMODA1 may form a gate line pattern continuously extending in the first row R1 and the second row R2 in the Y axis direction. The adder cell HAC according to embodiments is not limited thereto. The first gate line GL11' of the first circuit area HMODA1 and the first gate line GL21' of the second circuit area HMODA2 may respectively form separate gate line patterns aligned in the Y axis direction and may be connected to each other through a first metal layer M1 and a second metal layer M2.

Figure 12:
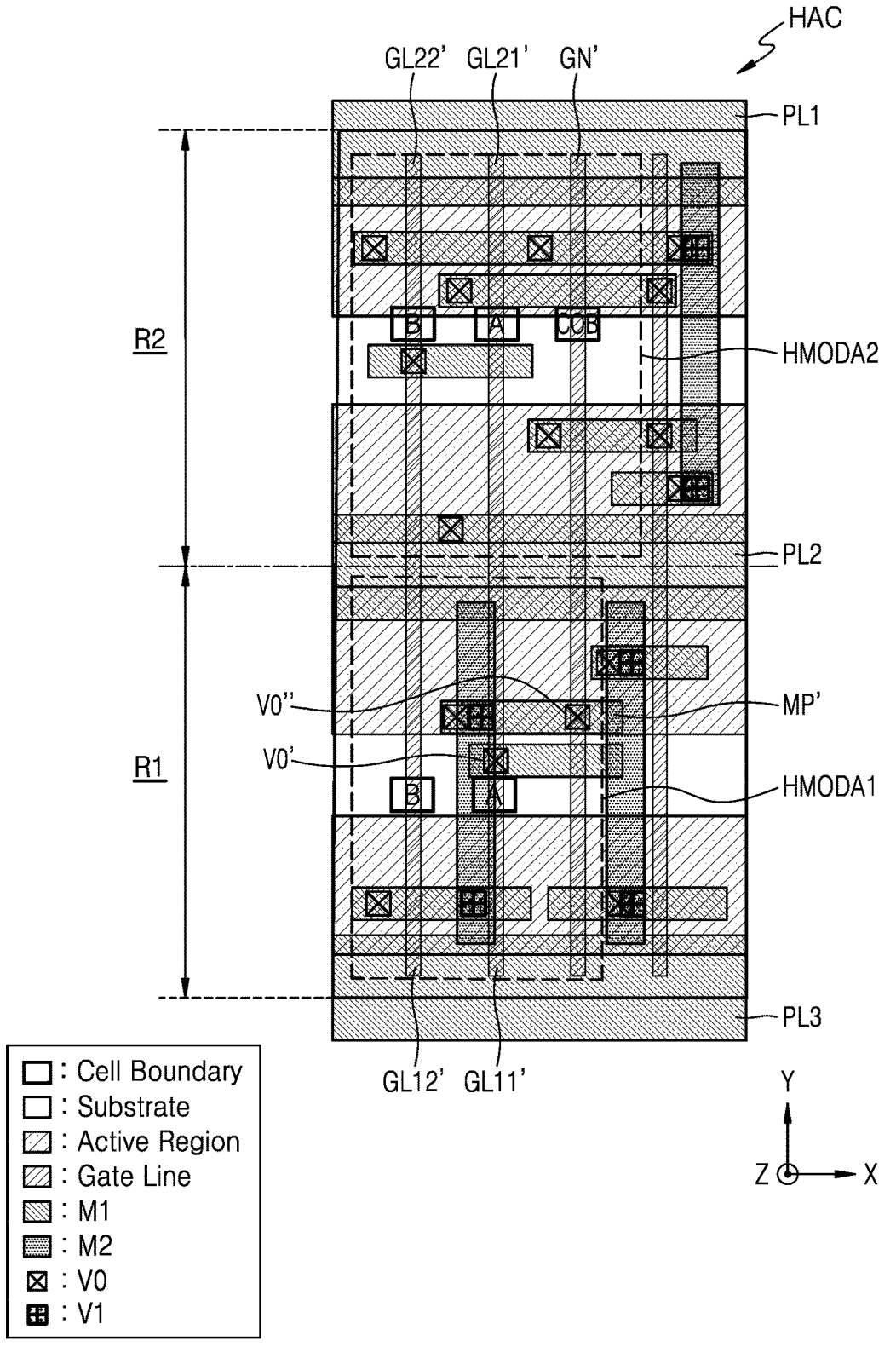

FIG. 12 is a plan view illustrating layout of an adder cell HAC according to an exemplary embodiment, which is a detailed example of the adder cell HAC illustrated in FIG. 11.

Referring to FIG. 12, the first input signal A may be applied to the first gate lines GL11' and GL21' included in the adder cell HAC and the second input signal B may be applied to the second gate lines GL12' and GL22' included in the adder cell HAC.

In an exemplary embodiment, because the first gate lines GL11' and GL21' of the first and second circuit areas HMODA1 and HMODA2 form one gate line pattern, the adder cell HAC may include one first via V0' connected to the first gate lines GL11' and GL21'. In addition, in an exemplary embodiment, because the second gate lines GL12' and GL22' of the first and second circuit areas HMODA1 and HMODA2 form one gate line pattern, the adder cell HAC may include one first via V0 connected to the second gate lines GL12' and GL22'. Therefore, the first via V0' connected to the first gate lines GL11' and GL21' may be arranged in one of the first row R1 and the second row R2 and the first via V0 connected to the second gate lines GL12' and GL22' may be arranged in one of the first row R1 and the second row R2.

In an exemplary embodiment, the inverted signal COB (for example, a voltage of the first node N1' of FIG. 10) of the carry output signal (for example, CO of FIG. 10) output from the first circuit area HMODA1 may be applied to the second circuit area HMODA2 through a pattern MP' of the first metal layer M1 and a gate line GN'. In an exemplary embodiment, the gate line GN' may form a gate line pattern continuously extending in the first row R1 and the second row R2. In an exemplary embodiment, the first via V0" connected to the gate line GN' to which the inverted signal COB of the carry output signal CO is applied may be arranged in one of the first row R1 and the second row R2 and the number of the first via may be 1.

In the adder cell HAC according to embodiments, the first gate lines GL11' and GL21' may be aligned in the Y axis direction or the second gate lines GL12' and GL22' may be aligned in the Y axis direction. Therefore, a wiring-length of a pattern (for example, a metal line) of the first metal layer M1 or the second metal layer M2, in order to connect the transistors formed in the adder cell HAC to one another or to apply the first and second input signals A and B to the transistors, formed in the adder cell HAC may be reduced. Therefore, capacitance of input/output pins formed in the adder cell HAC and cell delay of the adder cell HAC may be reduced. In addition, power consumption of the integrated circuit (for example, integrated circuit 10' of FIG. 11) including the adder cell HAC may be reduced.

Figure 13:
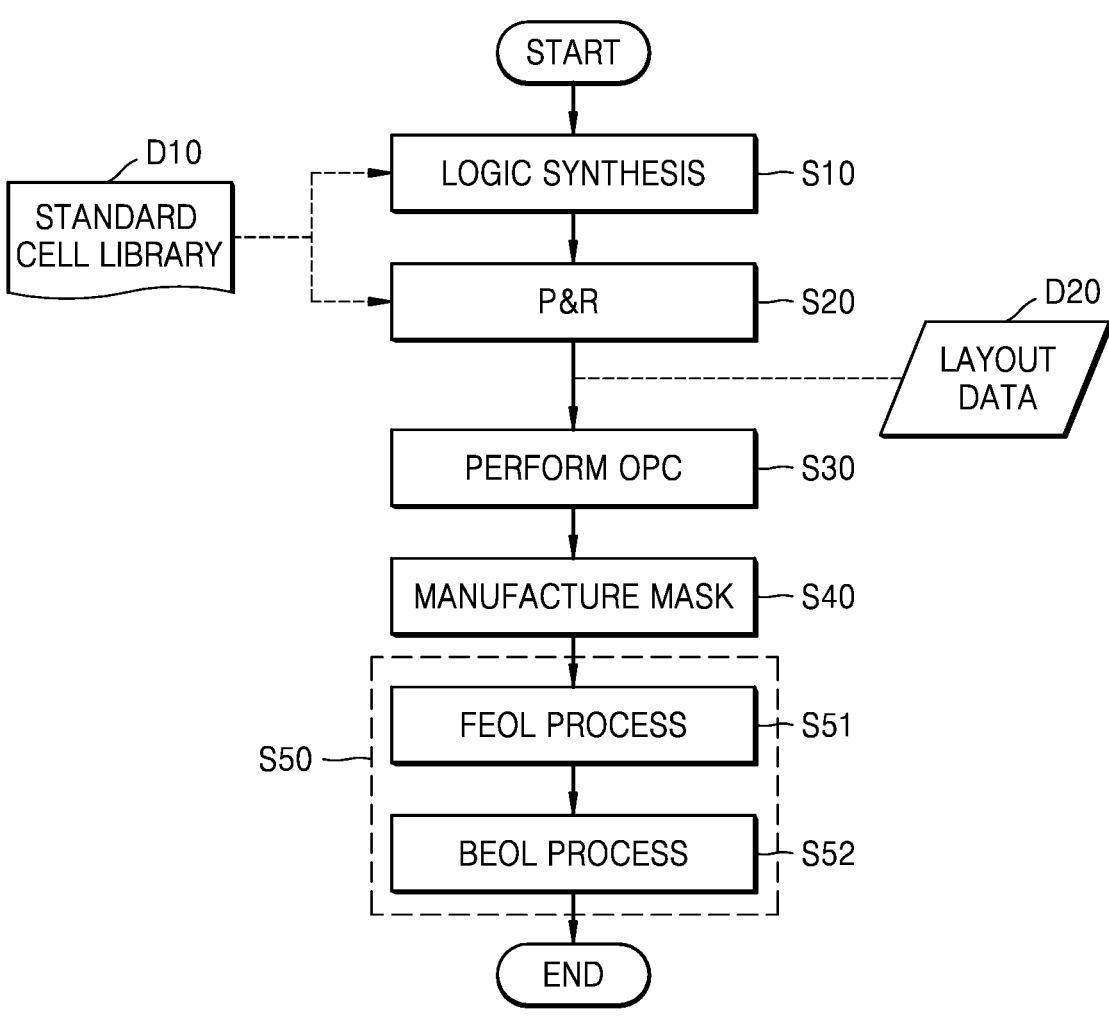
FIG. 13 is a flowchart illustrating a method of manufacturing an integrated circuit according to an exemplary embodiment.

FIG. 13 is a flowchart illustrating a method of manufacturing an integrated circuit according to an exemplary embodiment.

Referring to FIG. 13, a standard cell library D10 may include information on standard cells, for example, function information, characteristic information, and layout information. The standard cell library D10 may include data defining layout of a standard cell. The standard cell library D10 may define layouts of adder cells (for example, the adder cells FAC, FAC_1, FAC_2, FAC_3, and HAC described with reference to FIGS. 1 to 12).

In operation S10, a logic synthesis operation of generating netlist data from RTL data may be performed. For example, a semiconductor design tool (for example, a logic synthesis tool) may generate netlist data including a bitstream or a netlist by performing logic synthesis with reference to the standard cell library D10 from the RTL data created by a hardware description language (HDL) such as a VHSIC hardware description language (VHDL) or Verilog.

In operation S20, with reference to the standard cell library D10, a place and routing (P&R) operation of generating layout data D20 from the netlist data may be performed. In the P&R operation S20, the standard cells may be arranged, interconnections may be generated, and the layout data D20 may be generated.

For example, the semiconductor design tool (for example, a P&R tool) may arrange a plurality of standard cells with reference to the standard cell library D10 from the netlist data. For example, the semiconductor design tool may select one of layouts of a standard cell defined by the netlist data with reference to the standard cell library D10 and may arrange the selected layout of the standard cell. For example, the semiconductor design tool may select at least one of the adder cells FAC, FAC_1, FAC_2, FAC_3, and HAC described with reference to FIGS. 1 to 12 and may arrange the selected one as an adder cell.

Mutual connection may electrically connect an output pin and an input pin of the standard cell and may include, for example, at least one via and at least one routing wiring line. The layout data D20 may have a format such as GDSII and may include geometric information of the standard cells and mutual communications In operation S30, optical proximity correction (OPC) may be performed. OPC may refer to a work for forming a pattern of a desired shape by correcting a distortion phenomenon such as refraction caused by a characteristic of light by photolithography included in semiconductor processes of manufacturing the integrated circuit and a pattern on a mask may be determined by applying the OPC to the layout data D20.

In operation S40, an operation of manufacturing a mask may be performed. For example, patterns on the mask may be defined in order to form patterns formed in a plurality of layers by applying the OPC to the layout data D20 and at least one mask (or photomask) for forming the patterns in the plurality of layers may be manufactured.

In operation S50, an operation of manufacturing an integrated circuit may be performed. For example, the integrated circuit may be manufactured by patterning the plurality of layers by using the at least one mask manufactured in operation S40. In an exemplary embodiment, operation S50 may include operations S51 and S52.

In operation S51, a front-end-of-line (FEOL) process may be performed. The FEOL may refer to a process of forming individual elements, for example, a transistor, a capacitor, and a resistor on a substrate in integrated circuit manufacturing processes.

In operation S52, a back-end-of-line (BEOL) process may be performed. The BEOL may refer to a process of connecting the individual elements, for example, the transistor, the capacitor, and the resistor to one another in the integrated circuit manufacturing processes.

Figure 14:
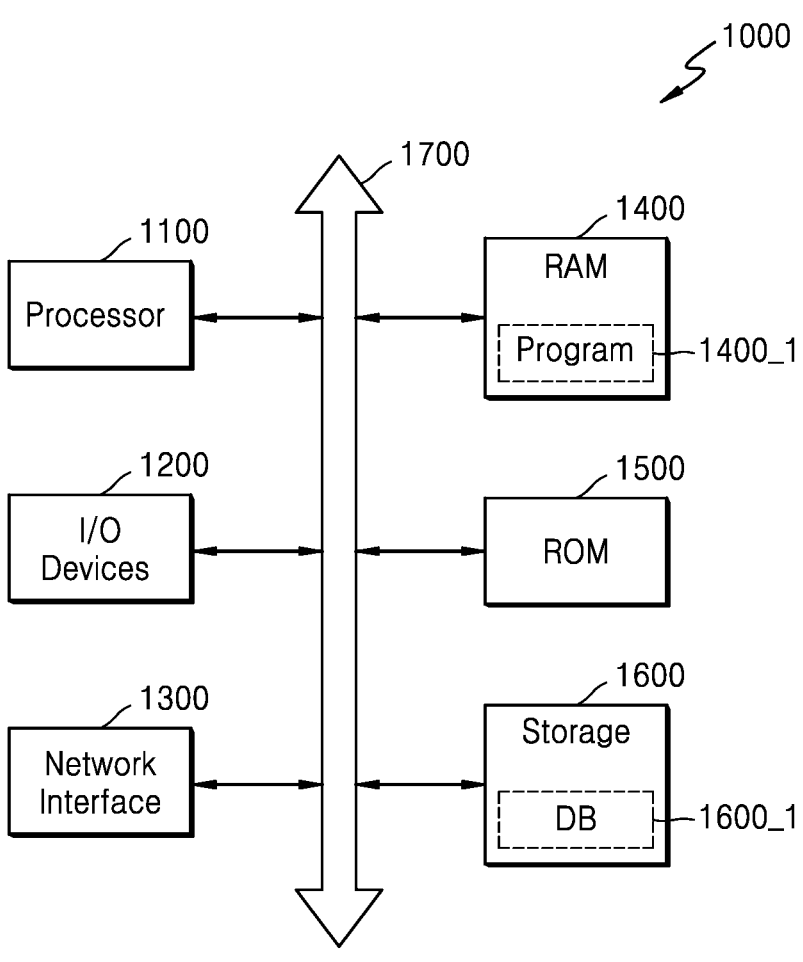
FIG. 14 is a block diagram illustrating a computing system including memory storing a program according to an exemplary embodiment.

FIG. 14 is a block diagram illustrating a computing system 1000 including memory storing a program according to an exemplary embodiment. At least some of processes included in a method of manufacturing an integrated circuit (for example, the method of manufacturing the integrated circuit of FIG. 13) according to an exemplary embodiment may be performed by the computing system 1000.

Referring to FIG. 14, the computing system 1000 may be a fixed computing system such as a desktop computer, a workstation, or a server or a portable computing system such as a laptop computer. The computing system 1000 may include a processor 1100, input and output devices 1200, a network interface 1300, random access memory (RAM) 1400, read only memory (ROM) 1500, and a storage 1600. The processor 1100, the input and output devices 1200, the network interface 1300, the RAM 1400, the ROM 1500, and the storage 1600 may communicate with one another through a bus 1700.

The processor 1100 may be referred to as a processing unit and may include, for example, at least one core capable of executing an arbitrary instruction set such as a microprocessor, an application processor (AP), a digital signal processor (DSP), or a graphic processing unit (GPU). For example, the processor 1100 may access the memory, that is, the RAM 1400 or the ROM 1500 through the bus 1700 and may execute instructions stored in the RAM 1400 or the ROM 1500.

The RAM 1400 may store a program 1400_1 for manufacturing the integrated circuit according to an exemplary embodiment or at least a part of the program 1400_1. For example, the program 1400_1 may include the semiconductor design tool and may include, for example, the logic synthesis tool and the P&R tool.

The program 1400_1 may have the processor 1100 perform at least some of the processes included in the method of manufacturing the integrated circuit of FIG. 13. That is, the program 1400_1 may include a plurality of instructions that may be executed by the processor 1100 and the plurality of instructions included in the program 1400_1 may have the processor 1100 perform at least some of the processes included in the method of manufacturing the integrated circuit of FIG. 13.

The storage 1600 may not lose stored data although power supplied to the computing system 1000 is blocked. For example, the storage 1600 may include a non-volatile memory device or a storage medium such as a magnetic tape, an optical disk, or a magnetic disk. The storage 1600 may store the program 1400_1 according to an exemplary embodiment and the program 1400_1 or at least a part thereof may be loaded from the storage 1600 on the RAM 1400 before the program 1400_1 is executed by the processor 1100. Unlikely, the storage 1600 may store a file created by a program language and the program 1400_1 generated by a compiler from a file or at least a part thereof may be loaded on the RAM 1400.

The storage 1600 may store a database 1600_1 and the database 1600_1 may include information required for designing the integrated circuit. For example, the database 1600_1 may include the standard cell library D10 of FIG. 13. In addition, the storage 1600 may store data to be processed by the processor 1100 or data processed by the processor 1100.

The input and output devices 1200 may include an input device such as a keyboard or a pointing device and an output device such as a display device or a printer. The network interface 1300 may provide access to a network outside the computing system 1000.

While embodiments have been particularly shown and described, it will be understood that various changes in form and details may be made therein without departing from the spirit and scope of the following claims.

What is claimed is:

1. A multi-height adder cell configured to receive a first input signal, a second input signal, and a carry input signal and output a sum output signal and a carry output signal, the multi-height adder cell comprising:
    a plurality of circuit areas, including a plurality of first gate lines to which the first input signal is applied and a plurality of second gate lines to which the second input signal is applied,
    wherein a first circuit area of the plurality of circuit areas and a second circuit area of the plurality of circuit areas is arranged in a first row,
    wherein a third circuit area of the plurality of circuit areas and a fourth circuit area of the plurality of circuit areas is arranged in a second row parallel with the first row in a first horizontal direction,
    wherein the first circuit area is spaced apart from the second circuit area in a second horizontal direction different from the first horizontal direction, and the third circuit area is spaced apart from the fourth circuit area in the second horizontal direction,
    wherein a first gate line formed in the first circuit area is aligned in the first horizontal direction with a first gate line formed in the third circuit area, and
    wherein a first gate line formed in the second circuit area is aligned in the first horizontal direction with a first gate line formed in the fourth circuit area.

2. The multi-height adder cell of claim 1, wherein the first gate line formed in the first circuit area and the first gate line formed in the third circuit area form one gate line pattern.

3. The multi-height adder cell of claim 1, wherein a second gate line formed in a circuit area arranged in the first row is aligned in the first horizontal direction with a second gate line formed in a circuit area arranged in the second row.

4. The multi-height adder cell of claim 3, wherein the second gate line formed in the circuit area arranged in the first row and the second gate line formed in the circuit area arranged in the second row form one gate line pattern.

5. The multi-height adder cell of claim 1,
    wherein a second gate line formed in the first circuit area is aligned in the first horizontal direction with a second gate line formed in the third circuit area, and
    wherein a second gate line formed in the second circuit area is aligned in the first horizontal direction with a second gate line formed in the fourth circuit area.

6. The multi-height adder cell of claim 5, wherein each of the plurality of circuit areas further comprises a metal layer formed on an upper layer of a first gate line and a second gate line, one or more first vias connecting the first gate line to a pattern of the metal layer, and one or more second vias connecting the second gate line to the pattern of the metal layer, and
    wherein a number of the one or more first vias is less than or equal to 2.

7. The multi-height adder cell of claim 5, wherein each of the plurality of circuit areas further comprises a metal layer formed on an upper layer of a first gate line and a second gate line, one or more first vias connecting the first gate line to a pattern of the metal layer, and one or more second vias connecting the second gate line to the pattern of the metal layer, and
    wherein the one or more first vias are arranged in one of the first row and the second row.

8. The multi-height adder cell of claim 5,
    wherein a third gate line formed in the first circuit area is aligned in the first horizontal direction with a third gate line formed in the third circuit area, and
    wherein the carry input signal is applied to the third gate line formed in the first circuit area and the third gate line formed in the third circuit area.

9. The multi-height adder cell of claim 1, wherein the third circuit area is arranged in the first row and the second row.

10. The multi-height adder cell of claim 9, wherein the first gate line formed in the first circuit area is aligned in the first horizontal direction with the first gate line formed in the fourth circuit area, and
    wherein a second gate line formed in the second circuit area is aligned in the first horizontal direction with a second gate line formed in the fourth circuit area.

11. The multi-height adder cell of claim 9, wherein a third gate line formed in the first circuit area is aligned in the first horizontal direction with a third gate line formed in the fourth circuit area, and wherein the carry input signal is applied to the third gate line formed in the first circuit area and the third gate line formed in the third circuit area.

12. The multi-height adder cell of claim 9, wherein each of the plurality of circuit areas further comprises a metal layer formed on an upper layer of a first gate line and a second gate line, one or more first vias connecting the first gate line to a pattern of the metal layer, and one or more second vias connecting the second gate line to the pattern of the metal layer, and wherein the one or more first vias are arranged in one of the first row and the second row.

13. The multi-height adder cell of claim 1, wherein the multi-height adder cell is a multilevel cell formed in a plurality of rows, and wherein the plurality of circuit areas are arranged in different rows among the plurality of rows.

14. A multi-height adder cell configured to receive a first input signal and a second input signal, and to output a sum output signal and a carry output signal, the multi-height adder cell comprising:

a first circuit area and a second circuit area, wherein the first input signal is applied to a first gate line of the first circuit area and a first gate line of the second circuit area, and the second input signal is applied to a second gate line of the first circuit area and a second gate line of the second circuit area, wherein the first circuit area is arranged in a first row and the second circuit area is arranged in a second row parallel with the first row in a first horizontal direction, wherein the first gate line of the first circuit area is aligned in the first horizontal direction with the first gate line of the second circuit area, wherein the second gate line of the first circuit area is aligned in the first horizontal direction with the second gate line of the second circuit area, and wherein the multi-height adder cell comprises at least one via connected to at least one from among the first gate line of the first circuit area, the second gate line of the first circuit area, the first gate line of the second circuit area, and the second gate line of the second circuit area.

15. The multi-height adder cell of claim 14, wherein each of the first circuit area and the second circuit area further comprises a metal layer formed on an upper layer of a first gate line and a second gate line and a plurality of vias connecting the first gate line and the second gate line to a pattern of the metal layer, and wherein vias connected to the first gate line of the first circuit area and the first gate line of the second circuit area are arranged in one of the first row and the second row.

16. The multi-height adder cell of claim 14, wherein an inverted signal of the carry output signal is output from the first circuit area and is applied to the second circuit area through a gate line, wherein a number of vias connected to the gate line to which the inverted signal of the carry output signal is applied is 1.

17. A multi-height adder cell configured to receive a first input signal, a second input signal, and a carry input signal and output a sum output signal and a carry output signal, the multi-height adder cell comprising:

a plurality of circuit areas, including a plurality of first gate lines to which the first input signal is applied and a plurality of second gate lines to which the second input signal is applied, wherein a first circuit area of the plurality of circuit areas and a second circuit area of the plurality of circuit areas are arranged in a first row, wherein a third circuit area of the plurality of circuit areas is arranged in a second row parallel with the first row in a first horizontal direction, wherein a fourth circuit area of the plurality of circuit areas is arranged in a third row parallel with the second row in the first horizontal direction, wherein a first gate line formed in the first circuit area arranged in the first row, a first gate line formed in the third circuit area arranged in the second row and a first gate line formed in the fourth circuit area arranged in the third row are aligned in the first horizontal direction with each other.

18. The multi-height adder cell of claim 17, wherein the first gate line formed in the first circuit area, the first gate line formed in the third circuit area, and the first gate line formed in the fourth circuit area are connected to each other.

* * * * *